United States Patent [19]
Ohishi et al.

[11] Patent Number: 5,349,413
[45] Date of Patent: Sep. 20, 1994

[54] SHEET-LIKE MATERIAL PROCESSING APPARATUS

[75] Inventors: Chikashi Ohishi; Hiroyuki Sasayama; Hisao Kanzaki, all of Shizuoka, Japan

[73] Assignee: Fuji Photo Film Co., Ltd., Kanagawa, Japan

[21] Appl. No.: 31,125

[22] Filed: Mar. 12, 1993

[30] Foreign Application Priority Data

| Mar. 13, 1992 | [JP] | Japan | 4-054734 |
| Mar. 18, 1992 | [JP] | Japan | 4-062471 |
| Feb. 8, 1993 | [JP] | Japan | 5-020287 |

[51] Int. Cl.5 ............................................. G03B 3/02
[52] U.S. Cl. .................................................. 354/324
[58] Field of Search ........ 354/324, 331, 336, 319–322; 118/651–658, 691

[56] References Cited

U.S. PATENT DOCUMENTS

| 3,589,261 | 6/1971 | Krikelis | 354/317 |
| 4,142,194 | 2/1979 | Hamlin. | |
| 4,454,833 | 6/1984 | McChesney et al. | 118/651 |
| 4,464,035 | 8/1984 | Schoering | 354/299 |
| 4,537,496 | 8/1985 | Ohba et al. | 118/691 |
| 4,785,321 | 11/1988 | Murasaki | 354/321 |
| 5,040,013 | 8/1991 | Kurokawa et al. | 354/322 |
| 5,066,570 | 11/1991 | Nakamura et al. | 354/322 |

*Primary Examiner*—D. Rutledge
*Attorney, Agent, or Firm*—Sughrue, Mion, Zinn, Macpeak & Seas

[57] ABSTRACT

A sheet-like material processing apparatus in which while a sheet-like material is interposed between and conveyed by a pair of rollers, excess processing solution is squeezed out from the sheet-like material, and the sheet-like material is processed. A solution supplying portion is provided at an upstream side of the pair of rollers and drips the processing solution. A blade-like member is provided at the upstream side of the pair of rollers. Movement of the processing solution is limited by the pair of rollers and the blade-like member.

18 Claims, 13 Drawing Sheets

SHEET-LIKE MATERIAL PROCESSING APPARATUS

BACKGROUND OF THE INVENTION

1. Field of the Invention

The present invention relates to a sheet-like material processing apparatus in which processing solutions are supplied to a sheet-like material while the sheet-like material is being conveyed and in which excess processing solutions are squeezed from the sheet-like material by the sheet-like material being interposed between and conveyed by pairs of rollers, so that the sheet-like material is processed.

2. Description of the Related Art

In a photosensitive lithographic printing plate automatic developing apparatus (hereinafter, "PS plate processor") which processes sheet-like materials such as photosensitive lithographic printing plates (hereinafter, "PS plates"), generally, processing such as developing, washing, gum processing and the like is effected while the PS plate is being conveyed substantially horizontally within the apparatus.

The PS plate, on which images have been recorded by a printing apparatus or the like, is sent into the PS plate processor. The PS plate is submerged in developing solution while being conveyed in a developing tank, or developing solution is sprayed to the surface of the PS plate on which the images are recorded (surface) so that the PS plate is subject to developing processing.

In the washing section, after a large amount of washing water has been sprayed on the plate surface between two pairs of conveying rollers, the excess washing solution is squeezed and removed by squeeze rollers. Further, the same structure is provided in the finishing section as well.

As a result, it is necessary to provide a 5 to 40 liter processing tank for the washing water and a large volume pump. Further, spray pipes which have a plurality of discharge openings formed therein and which spray a large amount of washing water are necessary, so that the device must be made quite large.

Moreover, it is necessary that the washing water be reliably sent to the reverse surface side of the PS plate. The amount of washing water used thereby becomes even greater. As it is necessary to have at least one spray pipe above the conveying path and at least one below the conveying path (a pair), the number of parts increases.

The washing water is circulated and used, and components of the developing solution may become mixed with the washing water. Therefore, sludge and foreign matter are generated, and the discharge openings of the spray pipes become blocked. Further, the sludge and foreign matter settle on the bottom of the processing tank so that the maintainability of the apparatus deteriorates.

The developing foreign matter and the like also adhere to the aforementioned conveying rollers. The conveying rollers above the conveying path are disposed at positions which are easily accessible by a worker when the cover of the apparatus casing is removed. These rollers can therefore be easily wiped clean. However, the rollers which are located beneath the conveying path are removed in order to be cleaned or serviced. This results in additional labor, and maintainability deteriorates.

SUMMARY OF THE INVENTION

In view of the aforementioned, an object of the present invention is to provide a sheet-like material processing apparatus in which the amount of processing solutions used is decreased without the processing performance being adversely effected.

Further, another object of the present invention is to provide a sheet-like material processing apparatus in which the number of parts can be reduced without the ability of the apparatus to process a reverse surface side of the sheet-like material being adversely effected.

Moreover, another object of the present invention is to provide a sheet-like material processing apparatus in which maintainability can be improved.

The present invention is a sheet-like material processing apparatus in which while a sheet-like material is interposed between and conveyed by a pair of rollers, excess processing solution is squeezed out from the sheet-like material, and the sheet-like material is processed, comprising: a solution supplying device provided at an upstream side of the pair of rollers for dripping the processing solution; and processing solution limiting means provided at an upstream side of the pair of rollers for limiting movement of the processing solution toward the upstream side, and for accumulating the processing solution by the pair of rollers and the processing solution limiting means.

In accordance with the present invention having the above-described structure, a portion defined by the processing solution movement limiting means, the sheet-like material, and the roller above the conveying path is a receiving portion of the processing solution. Therefore, by dripping a small amount of the processing solution from the solution supplying pipe, the processing solution accumulates on the surface of the sheet-like material. As a result, the surface of the sheet-like material which is conveyed by the pair of rollers can be processed by the processing solution.

In this way, by forming the receiving portion of the processing solution on the surface of the sheet-like material, the sheet-like material can be reliably processed by only a small amount of processing solution being dripped thereon. The amount of processing solution used can be greatly decreased without the processing capability deteriorating.

Further, according to another aspect of the present invention, an end portion of the processing solution movement limiting means contacts the surface of the roller of the pair of rollers which is disposed above the conveying path. As a result, the processing solution which has dripped down accumulates in a V-shaped concave portion formed by the surface of the roller and the processing solution movement limiting means. A membrane of the processing solution is formed on the surface of the roller between the surface of the roller and the processing solution movement limiting means. The processing solution is applied to the sheet-like material as the roller rotates.

Another aspect of the present invention is a sheet-like material processing apparatus in which while a sheet-like material is interposed between and conveyed by a pair of rollers, excess processing solution is squeezed out from the sheet-like material, and the sheet-like material is processed, further comprising: a processing solution accumulating member receiving and accumulating the processing solution which flows down from transverse direction ends of the sheet-like material and in which only a lower roller of the pair of rollers which is located at a lower side of a conveying path of the sheet-like material is submerged; and a flow-out portion provided at a central portion corresponding to transverse direction ends of the sheet-like material, on a vertical wall of the processing solution accumulating member, for letting excess processing solution within the processing solution accumulating member flow out from the flow-out portion.

According to the present invention having the above-described structure, the processing solution accumulated on the surface of the sheet-like material flows down from transverse direction end portions of the sheet-like material and reaches the processing solution accumulating member. In this case, the processing solution flows into end portions of the processing solution accumulating member which correspond to transverse direction end portions of the sheet-like material.

The processing solution which accumulates in the processing solution accumulating member is drawn up by the roller beneath the conveying path as the roller rotates, and processes the reverse surface of the sheet-like material. Thereafter, the processing solution is returned to the processing solution accumulating member.

The degree of fatigue of the processing solution which flows down from the surface of the sheet-like material is relatively low, and the degree of fatigue of the processing solution which has been used to process the reverse surface of the sheet-like material is high.

The flow-out portion is formed to so that the processing solution flows out first at a position which corresponds to the central portion, in the transverse direction of the sheet-like material, of the processing solution accumulating member (i.e., at the position on the path of flow of the processing solution which is the furthest away from the position at which the processing solution flows down into the processing solution accumulating member from the surface of the sheet-like material. The position at which the processing solution flows out is preferably a central portion, in the transverse direction of the sheet-like material, of the upstream side vertical wall). The processing solution used to process the reverse surface flows out from the processing solution accumulating member before the processing solution which has flowed down from the surface of the sheet-like material. As a result, the degree of fatigue of the processing solution, which is drawn up from the processing solution accumulating member by the lower roller and which is used to process the reverse surface side of the sheet-like material, is low. Accordingly, processing can be effected without deterioration of the apparatus' ability to process the reverse side surface of the sheet-like material, and there is no need to provide a spray or the like at the lower side of the conveying path.

Further, according to another aspect of the present invention, there is a sheet-like material processing apparatus for squeezing out excess processing solution from a sheet-like material and for processing the sheet-like material by the processing solution while the sheet-like material is interposed between and conveyed by a pair of rollers, comprising: a pan accumulating the processing solution in which only one of the pair of rollers which is located at a lower side of a conveying path of the sheet-like material is submerged in the processing solution; and a cleaning member accommodated in the pan and contacting a circumferential surface of the roller which is located at the lower side of the conveying path of the sheet-like material.

According to the present invention having the above-described structure, the cleaning member is disposed within the pan so as to abut the roller at the lower side of the conveying path. The dirt on the circumferential surface of the roller beneath the conveying path can thereby be wiped off as the roller rotates. Accordingly, because dirt such as developing foreign matter and the like adhering to the lower roller is frequently removed, labor involved in removing the lower roller and the like can be eliminated, and maintainability of the apparatus improves.

Further, another aspect of the present invention is an automatic developing apparatus for photosensitive lithographic printing plates in which the photosensitive lithographic printing plates are conveyed through developing solution in a developing tank so that the photosensitive lithographic printing plates are developed, the photosensitive lithographic printing plates being subject to washing by washing water and to desensitization by gum solution and being dried, the automatic developing apparatus comprising: a casing which prevents at least the developing tank from being exposed to outside, the casing having an insertion opening through which the photosensitive lithographic printing plates are inserted and a discharge opening through which the photosensitive lithographic printing plates are discharged; a first cover provided at and usually closing the insertion opening of the casing, and being opened so that the photosensitive lithographic printing plates are insertable when the photosensitive lithographic printing plates are inserted and the first cover is pushed by the photosensitive lithographic printing plates; and a second cover provided at and usually closing the discharge opening of the casing, and being opened so that the photosensitive lithographic printing plates are dischargeable without contacting the second cover when the photosensitive lithographic printing plates are discharged from the casing.

In accordance with the present invention having the above-described structure, when the photosensitive lithographic printing plate reaches the insertion opening, the first cover body is opened, and the photosensitive lithographic printing plate is inserted smoothly into the interior of the casing. For example, a pair of elastic blade-like members can be used as the first cover body. The blade-like members usually contact each other due to their elasticities so that the insertion opening is closed. When the photosensitive lithographic printing plate is inserted, the blade-like members are opened against their elasticities due to the pushing force of the photosensitive lithographic printing plate which is being conveyed. Therefore, the photosensitive lithographic printing plate is inserted smoothly from the insertion opening.

The photosensitive lithographic printing plate is submerged in developing solution in the developing tank. After being subject to subsequent washing processing and desensitization processing, the photosensitive lithographic printing plate reaches the discharge opening. The second cover body provided at the discharge opening is usually closed, but is open at least at the time when the photosensitive lithographic printing plate is discharged from the interior of the casing. Therefore, the photosensitive lithographic printing plate is discharged from the discharge opening without contacting the cover body. Namely, there are no drawbacks such as the images formed on the photosensitive surface of the photosensitive lithographic printing plate being damaged, and the quality of the images can be maintained.

Further, in accordance with another aspect of the present invention, the automatic developing apparatus includes a surface cover covering and contacting the surface of the developing solution accumulated in the developing tank and isolating the developing solution from air.

In accordance with the present invention having the aforementioned structure, both the casing and the liquid surface cover are used. The liquid surface cover contacts the surface of the developing solution within the developing tank so as to more completely isolate the developing solution from the air. In conventional apparatuses, when the total surface area which is subject to developing processing in one day is small, the amount of moisture which evaporates and the $CO_2$ gas within the air are effected, and the amount of replenished developing solution per processed unit surface area must be increased. However, in the present invention, because there is no problem with respect to evaporation and the $CO_2$ gas within the air, an extremely small, constant amount of replenishing solution may be used per unit surface area regardless of the total surface area processed in one day. Therefore, expensive, complex automatic replenishing devices are unnecessary. Further, the cost of manufacturing the apparatus of the present invention can be lowered.

Moreover, for the same reasons, dried portions of the processing solution do not precipitate in the drive mechanism of the rollers and in the solution supplying holes, and there is less dirt on the walls within the processing tanks. Therefore, maintenance of the apparatus is facilitated.

The degree of fatigue of the processing solution is low, and the amount of processing solution replenished per unit surface area does not depend on the total surface area processed in one day. In the present invention, in addition to these merits which were described above, the stability of processing is improved.

Further, because the amount of replenished solution is small and the amount of waste solution is small, the cost of operating the apparatus is low.

The automatic processor for photosensitive lithographic printing plates relating to the present invention has a superior effect in that the insertion opening and the discharge opening of the casing which encloses the developing tank can be reliably closed, and the photosensitive lithographic printing plate can pass through the discharge opening without the photosensitive surface being damaged.

Another aspect of the present invention is an automatic developing apparatus for processing photosensitive lithographic printing plates, comprising: a developing section, one of processing sections of the automatic developing apparatus in which a photosensitive lithographic printing plate is processed by developing solution while being conveyed; a rinsing section for rinsing a photosensitive lithographic printing plate by supplying rinsing solution to both surfaces of the photosensitive lithographic printing plate while the photosensitive lithographic printing plate is being conveyed, the rinsing solution being dripped onto an upper surface of the photosensitive lithographic printing plate, the rinsing solution which flows down from the upper surface being accumulated for supplying to an under surface of the printing plate, and the rinsing solution being discharged; and a casing for enclosing a processing region of the photosensitive lithographic printing plate including at least one of the developing section and the rinsing section to prevent the at least one of the developing solution and the rinsing solution from being exposed to outside, the casing having an insertion opening through which the photosensitive lithographic printing plate is inserted into the casing and a discharge opening through which the photoresist five lithographic printing plate is discharged from the casing.

In accordance with the present invention having the above-described structure, rinsing solution is supplied to one surface (the upper surface) of the photosensitive lithographic printing plate so that the photosensitive lithographic printing plate is processed. Thereafter, the rinsing solution which has flowed down from the one surface (upper surface) of the photosensitive lithographic printing plate is accumulated, and the other surface (bottom surface) of the photosensitive lithographic printing plate is processed by the accumulated rinsing solution.

The rinsing solution which has been used to process the other surface (bottom surface) of the photosensitive lithographic printing plate is discharged. Because a small amount of rinsing solution is supplied to the photosensitive lithographic printing plate (namely, the minimum amount of rinsing solution necessary to process the one surface and the other surface of the photosensitive lithographic printing plate), the amount of rinsing solution which is discharged is small.

In the processing section, at least one of the developing solution and the rinsing solution are covered by the casing which deters exposure with the outside air. The insertion opening and the discharge opening of the casing are partitioned and closed off by covers. Therefore, for each processing solution, the amount of processing solution which evaporates can be held down. The adhesion of precipitate to the conveying system (e.g., the rollers), the processing solution supplying system (e.g., the solution supplying pipes) and the like, and the deterioration of the images of the photosensitive lithographic printing plate can be prevented.

In this way, it is not necessary to provide a tank used to circulate the rinsing solution. Exposure of at least one of the developing solution and the rinsing solution to the outside air is deterred by the covers provided at the casing. Therefore, the amount of processing solution which evaporates can be greatly reduced. The stability of processing and the maintainability of the apparatus can be improved.

According to another aspect of the present invention the rinsing solution of an automatic developing apparatus for photosensitive lithographic printing plates is water, and the water which has been used for rinsing is supplied from the rinsing section to the developing section as diluting solution for replenishing solution developing agent.

In accordance with the present invention having the aforementioned structure, after one surface of the photosensitive lithographic printing plate has been processed by the rinsing solution in the rinsing section, the other surface is processed by the rinsing solution which flows down and accumulates. This rinsing solution is supplied from the rinsing section as diluted solution of replenishing solution replenished to the developing section. In this way, the disposed amount of rinsing solution used to process the photosensitive lithographic printing plate can be decreased, and the amount of diluted solution for the replenishing solution can be decreased.

According to another aspect of the present invention, the automatic developing apparatus for photosensitive lithographic printing plates includes partitioning plates dividing the processing region into each processing section or blocks containing some processing sections, and partitioning the blocks without interfering with a passing of the photosensitive lithographic printing plate.

According to the present invention with the above-described structure, evaporation of the processing solutions can be greatly reduced due to the casing which has an insertion opening and a discharge opening at which covers are respectively provided. As the photosensitive lithographic printing plate is conveyed, some of the processing solution evaporates (for example, when the apparatus is opened when the photosensitive lithographic printing plate is inserted therein or discharged therefrom). Further, even when photosensitive lithographic printing plates are not being processed, because a large region of the apparatus is covered by the casing, some evaporation of the processing solutions occurs. In the present aspect, the processing region is divided into blocks per processing section or into blocks formed by a plurality of processing sections. By placing the covers between the blocks, a small space is provided for each of the processing sections, and the evaporation of the processing solutions can be suppressed. This prevents the respective, evaporated solutions from becoming mixed and returning to the processing tanks as condensation. This is especially important in cases in which the processing solutions include organic solvents.

Further, another aspect of the present invention is an automatic developing apparatus for photosensitive lithographic printing plates in which a photosensitive lithographic printing plate is conveyed to pass through at least one of a developing section and a rinsing section, which are processing sections to process the photosensitive lithographic printing plate, the automatic developing apparatus comprising: a casing enclosing a processing region of the photosensitive lithographic printing plate including at least one of the processing sections for preventing at least one of processing solutions from being exposed to outside, the casing having an insertion opening through which the photosensitive lithographic printing plate is inserted and a discharge opening through which the photosensitive lithographic printing plate is discharged; partitioning plates dividing the processing region into one of blocks for each processing section and blocks formed by a plurality of processing sections, the partitioning plates being provided between the blocks and at the insertion opening and the discharge opening of the casing, and the partitioning plates closing the insertion opening and the discharge opening and partitioning each of the blocks without interfering with a passing of the photosensitive lithographic printing plate; and moving means for moving the partitioning plates to closed positions and open positions.

In accordance with the present invention structured as described above, the positioning plates can be moved to closed positions and open positions. By placing the covers, which are provided between the blocks, and at least one of the insertion opening and the discharge opening of the photosensitive lithographic printing plate at their open positions, outside air can be introduced into the apparatus, By placing the covers at appropriate open positions, the prevention of condensation and planned increases in the amount of replenishing solution replenished with respect to the processing solution can be effected.

According to another aspect of the present invention, there is an automatic developing apparatus for processing photosensitive lithographic printing plates in which a photosensitive lithographic printing plate is conveyed and is processed by at least developing solution in a processing section having a developing section and a rinsing section, comprising: a casing for deterring at least the developing solution from being exposed to outside and for enclosing at least the developing section in which the photosensitive lithographic printing plate is processed by the developing solution, the casing having an insertion opening through which the photosensitive lithographic printing plate is inserted and a discharge opening through which the photosensitive lithographic printing plate is discharged; partitioning plates provided at the insertion opening and the discharge opening, and opening and closing the insertion opening and the discharge opening without interfering when the photosensitive lithographic printing plate passes through the insertion opening and the discharge opening; and rinsing solution supplying means for supplying rinsing solution, which has been used to process the photosensitive lithographic printing plate in the rinsing section, from the rinsing section to the developing section as diluting solution for diluting replenishing solution which is replenished to the developing solution in the developing section, the rinsing solution being water.

In accordance with the above-described aspect of the present invention, at least the developing section is closed by the casing, which deters at least the developing solution from being exposed to the outside air, and is closed by the covers, which are provided at the insertion opening and the discharge opening of the photosensitive lithographic printing plate. Therefore, the fatigue ($CO_2$ fatigue) of the processing solutions due to the processing solutions being exposed to the outside air can be greatly decreased. Further, because the amount of evaporation of the processing solutions can be greatly reduced, the stability of processing and maintainability of the apparatus can be improved.

Further, water is used in the rinsing solution which processes the photosensitive lithographic printing plate in the rinsing section. A rinsing solution supplying means is provided to supply this water to the developing section as diluted solution of the replenishing solution which is replenished to the developing section. Therefore, the apparatus which supplies the diluted solution of the replenishing solution can be made more compact.

Further, in accordance with another aspect of the present invention, one of the partitioning plates which is provided at the discharge opening is withdrawn from a closed position to a position at which the one of the partitioning plates does not contact the photosensitive lithographic printing plate when the photosensitive lithographic printing plate passes through the processing sections.

In accordance with the present invention having the above-described structure, the cover provided at the discharge opening is usually closed. When the photosensitive lithographic printing plate is discharged from the interior of the casing, the cover is set in its open state. Therefore, the photosensitive lithographic printing plate is discharged from the discharge opening without contacting the cover. Namely, there are no drawbacks such as the images formed on the photosensitive surface of the photosensitive lithographic printing plate being damaged.

In the automatic developing apparatus for photosensitive lithographic printing plates relating to the present invention, the blocks for each processing section or the blocks formed by a combination of a plurality of processing sections are enclosed by the casing and the covers so that the entry of outside air is prevented. The automatic developing apparatus has superior effects in that stability of processing improves, the amount of processing solution to be disposed of is greatly reduced, the apparatus can be made more compact, and maintenance work can be improved.

DESCRIPTION OF THE PREFERRED EMBODIMENTS

Figure 1:
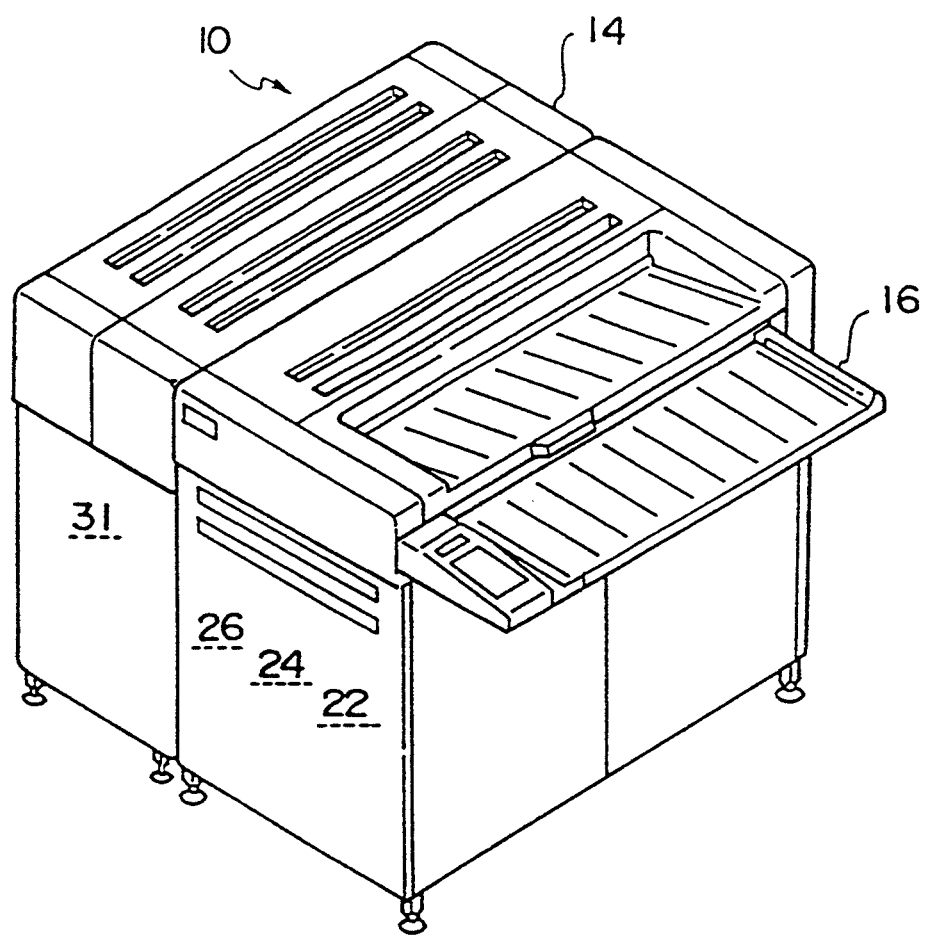
FIG. 1 is a perspective view of a PS plate processor relating to a first embodiment of the present invention.
Figure 2:
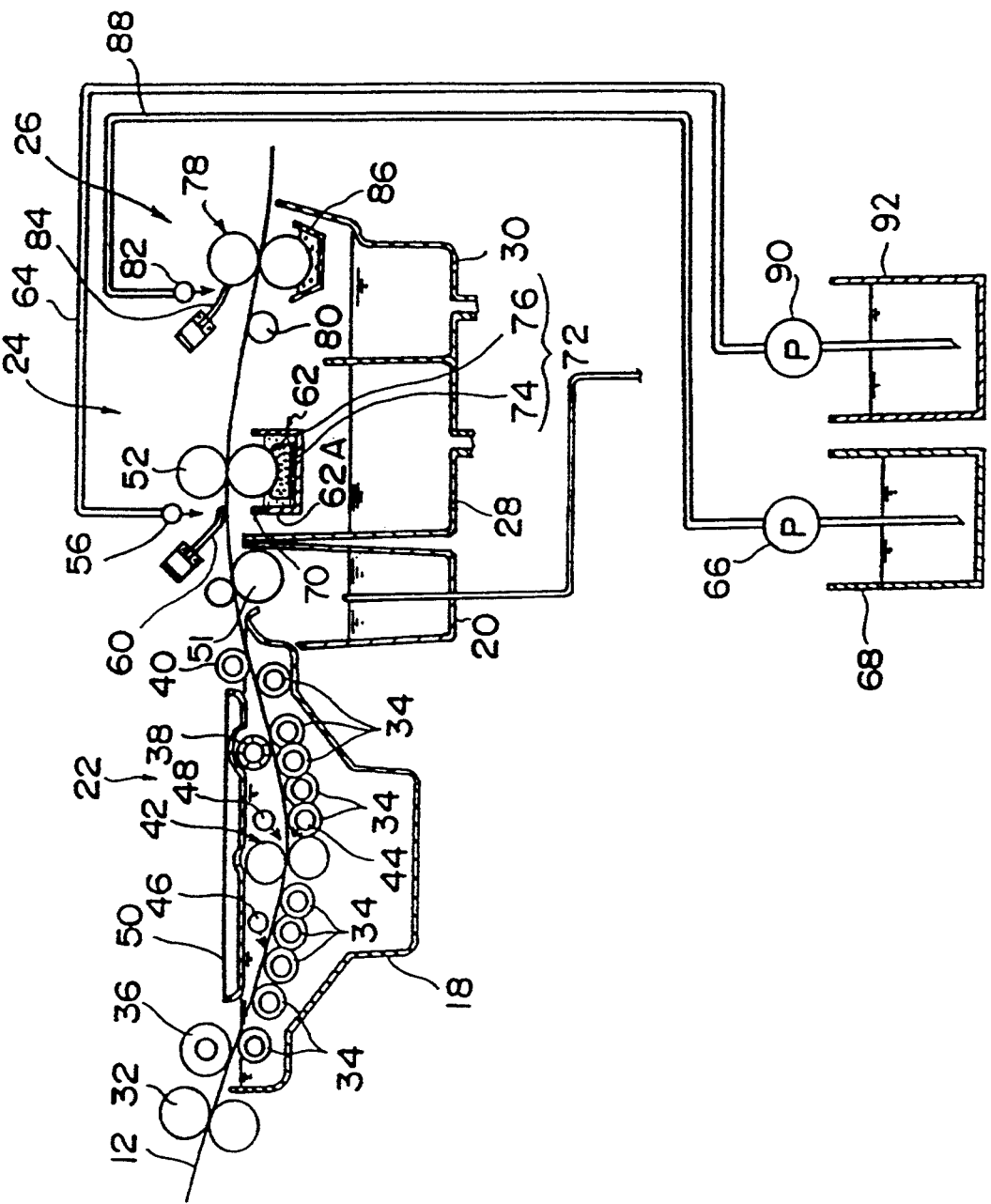
FIG. 2 is a schematic structural view of the PS plate processor relating to the first embodiment of the present invention.

FIGS. 1 and 2 illustrate a photosensitive lithographic printing plate automatic developing apparatus 10 (hereinafter referred to as "PS plate processor 10") relating to the present embodiment. A photosensitive lithographic printing plate 12 (hereinafter, "PS plate 12") on which images have been printed by an unillustrated printing device is subject to developing processing by the PS plate processor 10 and is then dried.

As illustrated in FIG. 1, processing sections in the interior of the PS plate processor 10 are covered by a casing 14. An insertion stand 16 is mounted to the casing in a vicinity of an insertion opening for the PS plate 12 (see FIG. 2). The PS plate 12 is loaded on the insertion stand 16, and is inserted from the insertion opening into the interior of the casing 14.

As shown in FIG. 2, a developing section 22, a washing section 24 and a finishing section 26 are disposed in an interior portion of the casing 14. The developing section 22 is equipped with a developing tank 18 for developing the PS plate 12 and an overflow tank 20 which recovers developing solution overflowing from the developing tank 18. In the washing section 24, developing solution adhering to the PS plate 12 is washed therefrom. In the finishing section 26, gum solution is applied to the washed PS plate 12, and the PS plate 12 is subject to desensitization processing.

Further, a washing water waste tank 28 is disposed within the washing section 24, and a gum solution waste tank 30 is disposed within the finishing section 26.

As shown in FIG. 1, a drying section 31 is provided downstream of the finishing section 26. In the drying section 31, the PS plate 12, which has been sent out of the finishing section 26, is conveyed by a plurality of unillustrated rollers, and is dried as warm air is blown to the surfaces of the PS plate 12. The dried PS plate 12 is discharged from the PS plate processor 10 to, for example, and unillustrated stocker or the like in which the PS plates 12 are propped up and stored.

As illustrated in FIG. 2, a pair of conveying rollers 32 is disposed at the side of insertion of the PS plate 12 into the developing tank 18 of the developing section 22. The PS plate 12, on which images have been printed, is inserted between the pair of conveying rollers 32. The pair of conveying rollers 32 send the PS plate 12 into the developing tank 18 downward at an angle of 15° with respect to the horizontal direction.

The top of the developing tank 18 is open. The central portion of the bottom portion of the developing tank 18 projects downward and is formed in a substantially rectangular configuration. Developing solution is accommodated within the developing tank 18. A plurality of guide rollers 34, which correspond to the configuration of the bottom of the developing tank 18 and all have the same diameter, are disposed within the developing tank 18. The guide rollers 34 are "skewer-type" rollers and are suspended between a pair of side plates of the developing tank 18 so as to be rotatable.

A guide roller 36, which has a larger diameter than that of the guide roller 34, is disposed downstream of the conveying rollers 32. A rotating brush roller 38 and a guide roller 40 are disposed above the downstream guide rollers 34, and are supported by the pair of side plates of the developing tank 18 so as to be rotatable.

Further, a pair of squeeze rollers 42 which functions to squeeze the surfaces of the PS plate 12 is disposed in a central portion of the developing tank 18. The guide rollers 34, 36, 40 rotate freely. Driving force from an unillustrated driving means is transferred to the rotating brush roller 38 and the squeeze rollers 42 so that the PS plate 12 is conveyed at a constant speed.

The pair of squeeze rollers 42 and the plurality of guide rollers 34 adjacent thereto are disposed in a vicinity of the bottom portion of the developing tank 18 so as to convey the PS plate 12 at a radius of curvature of 300 to 350 mm. Accordingly, the PS plate 12 which is held between and conveyed by the pair of conveying rollers 32 into the developing tank 18 is conveyed at a downward incline as the PS plate 12 passes between the guide rollers 36 and the guide rollers 34. The PS plate 12 is also conveyed at a downward incline by the plurality of guide rollers 34, and is inserted between the squeeze rollers 42. The squeeze rollers 42 remove waste matter, which was eluted from the photosensitive layer side (the upper side in FIG. 2) of the PS plate 12 in the developing solution, from the surface of the photosensitive layer side, so that the waste matter is separated from the PS plate 12 and is not conveyed downstream along with the movement of the PS plate 12.

The PS plate 12, which is sent out from the squeeze rollers 42, is directed at an upward incline by the guide rollers 34, is guided by the rotating brush roller 38 and the guide roller 40, and is discharged from the developing tank 18. Accordingly, the PS plate 12 is smoothly and reliably conveyed while being submerged in the developing solution without any excessive force being applied to the PS plate 12.

The guide roller 34, which is nearest to the squeeze rollers 42 at the downstream side of the squeeze rollers 42, is formed as a skewer-type roller having a plurality of elastic rotating members supported axially on the outer circumference of the shaft of the guide roller 34. The shaft is formed as a hollow pipe. A spray pipe 44 is formed in the hollow pipe. Discharge openings are formed in the spray pipe 44 along the axial direction between the elastic rotating members. Further, spray pipes 46, 48 are disposed above the conveying path of the PS plate 12 in a vicinity of the pair of squeeze rollers 42. A plurality of unillustrated discharge openings is formed in the respective outer circumferential surfaces of the hollow pipes of the spray pipes 46, 48 so as to communicate with the respective interiors of the spray pipes 46, 48. The axial directions of the spray pipes 46, 48 run along the transverse direction of the conveying path. The spray pipes 46, 48 and the spray pipe 44 of the guide roller 34 discharge developing solution toward the surface and the reverse surface of the PS plate 12. The spray pipes 44, 46, 48 discharge developing solution toward the upstream direction of the PS plate 12, so as to remove waste matter from the surface of the PS plate 12 at the initial stages of development and so as to supply new developing solution.

The overflow tank 20 is disposed at the downstream side of the developing tank 18 in the conveying direction of the PS plate 12. The PS plate 12 is conveyed above the overflow tank 20 by a pair of developing squeeze rollers 51. Further, the downstream side wall of the developing tank 18 is curved toward the outside so that the top edge thereof is positioned above the overflow tank 20. Accordingly, when the developing tank 18 has been completely filled with developing solution and the developing solution overflows therefrom, the developing solution overflows into the overflow tank 20.

Further, the surface of the developing solution within the developing tank 18 is covered by a floating cover 50. The floating cover 50 prevents the deterioration of the developing solution which occurs when the developing solution absorbs carbon dioxide within the air and the alkali components within the developing solution are neutralized. Because the floating cover 50 is formed of foam nylon, it floats on the surface of the developing solution within the developing tank 18 and moves vertically along with changes in the level of the liquid surface.

The replenishing apparatus disclosed in Japanese Patent Application Laid-Open No. 1-180542 can be used to replenish the replenishing solution to the developing tank 18 illustrated in FIG. 2.

Figure 3:
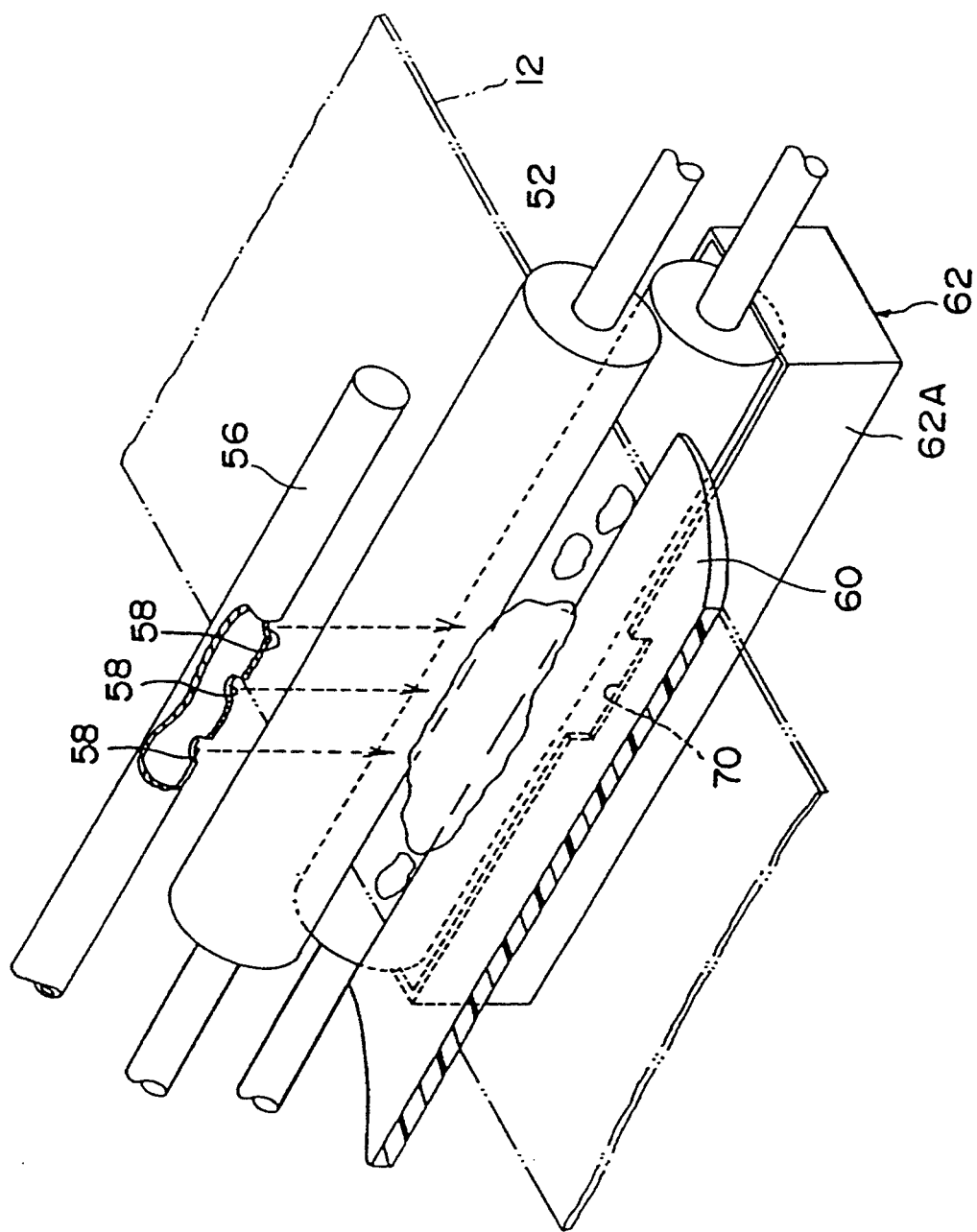
FIG. 3 is a perspective view illustrating a structure of a washing section relating to first and second embodiments of the present invention.
Figure 4:
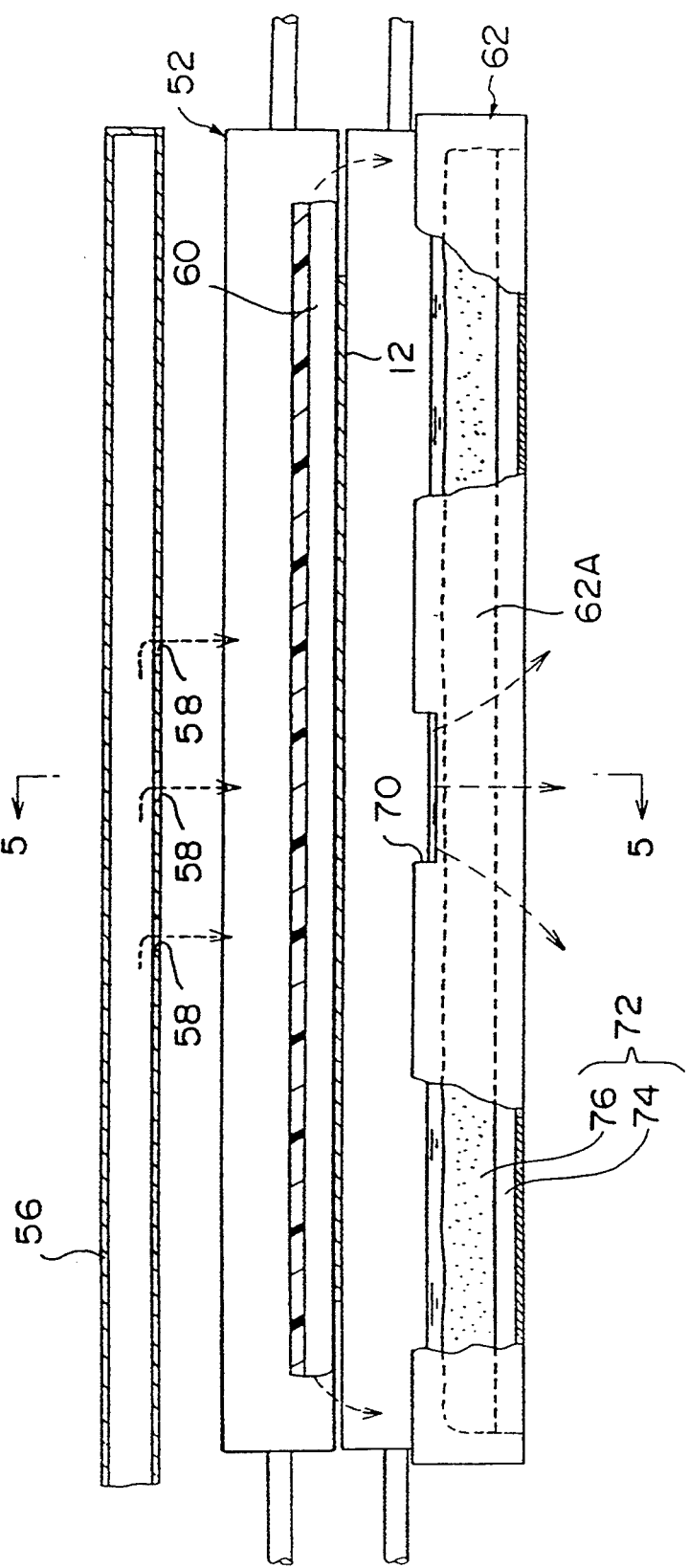
FIG. 4 is a front view, as seen from an upstream side in a conveying direction of a PS plate, of the washing section relating to the first embodiment of the present invention.
Figure 5:
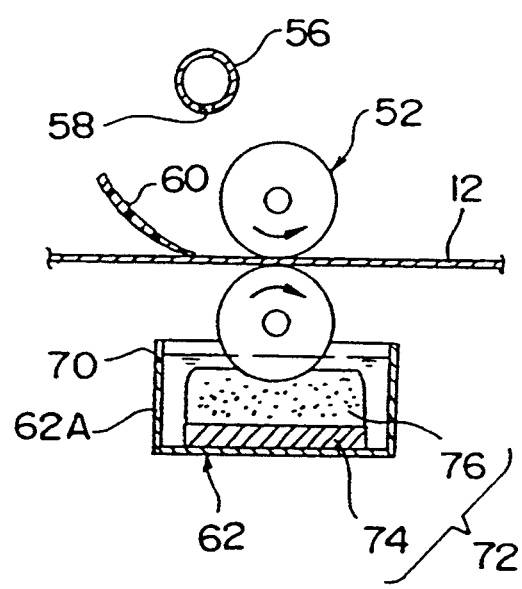
FIG. 5 is a sectional view taken along line 5—5 of FIG. 4 and relating to the first embodiment of the present invention.

In the PS plate processor 10, the washing water waste tank 28 of the washing section 24 is disposed at the downstream side of the overflow tank 20 of the developing section 22. As illustrated in FIGS. 3 through 5, a pair of conveying rollers 52 is disposed above the washing water waste tank 28. The conveying rollers 52 are rotatably supported by unillustrated side plates, and are rotated by a moving force transferred thereto by an unillustrated driving means. The conveying rollers 52 form the conveying path of the FS plate 12 sent from the developing section 22.

Washing water which has washed the developing solution from the PS plate 12 sent from the developing tank 18 falls and is collected in the washing water waste tank 28. A solution supplying pipe 56 is disposed upstream of and higher than the conveying rollers 52. Three discharge openings 58 (see FIG. 3) are provided in a central portion of the solution supplying pipe 56. Three of these discharge openings 58 are provided so that the washing water may be supplied even if one of the discharge openings 58 becomes blocked. It is preferable that the discharge openings 58 are provided centrally in the transverse direction of the PS plate 12 and are disposed at an upstream side of the conveying rollers 52. This position is an optimal position for the flow path of the liquid in a pan 62. The washing water drips from the discharge openings 58 onto the surface of the PS plate 12 so that the surface of the PS plate 12 is washed by the washing water.

Further, a flexible blade-like member 60 is disposed upstream of the solution supplying pipe 56. The blade-like member 60 is disposed at a position at which the end thereof interferes with the locus of movement of the PS plate 12 being conveyed and slidingly contacts the surface of the PS plate 12 being conveyed. As a result, the blade-like member 60 functions to accumulate the washing water, which has dripped from the solution supplying pipe 56, on the portion of the surface of the PS plate 12 located between the conveying rollers 52 and the blade-like member 60.

Further, the lower portion of the conveying roller 52 beneath the conveying path is accommodated in the pan 62, in which washing water is stored. As the lower conveying roller 52 rotates, washing water is drawn up so that the reverse surface of the PS plate 12 is washed and so that drying of the upper conveying roller 52 is prevented.

As illustrated in FIG. 2, one end of a piping 64 is connected to the solution supplying pipe 56. The piping 64 passes through a pump 90, and the other end of the piping 64 is disposed in a washing water replenishing tank 92. New washing water is stored within the washing water replenishing tank 92. By operating the pump 90 appropriately, an appropriate amount of washing water can be made to drip from the discharge openings 58 of the solution supplying pipe 56. In the present embodiment, the discharge capacity of the pump 90 is 33 cm/m$^2$.

As shown in FIG. 3, a receiving portion is formed by the blade-like member 60, the surface of the PS plate 12 and the upper conveying roller 52. A small amount of the washing water which drips from the solution supplying pipe 56 accumulates on the PS plate 12 in this receiving portion and diffuses along the transverse direction of the PS plate 12. As a result, the surface of the PS plate 12 which is being conveyed can successively and efficiently be washed by a small amount of washing water.

Because the end portion of the blade-like member 60 contacts the surface of the PS plate 12, the washing water accumulating on the surface of the PS plate 12 is prevented from flowing backward.

The washing water which accumulates on the surface of the PS plate 12 flows down from both transverse direction ends of the PS plate 12 into the pan 62. Namely, the washing water which is used to wash the surface of the PS plate 12 flows downward to both longitudinal direction end portions of the pan 62.

Figure 6:
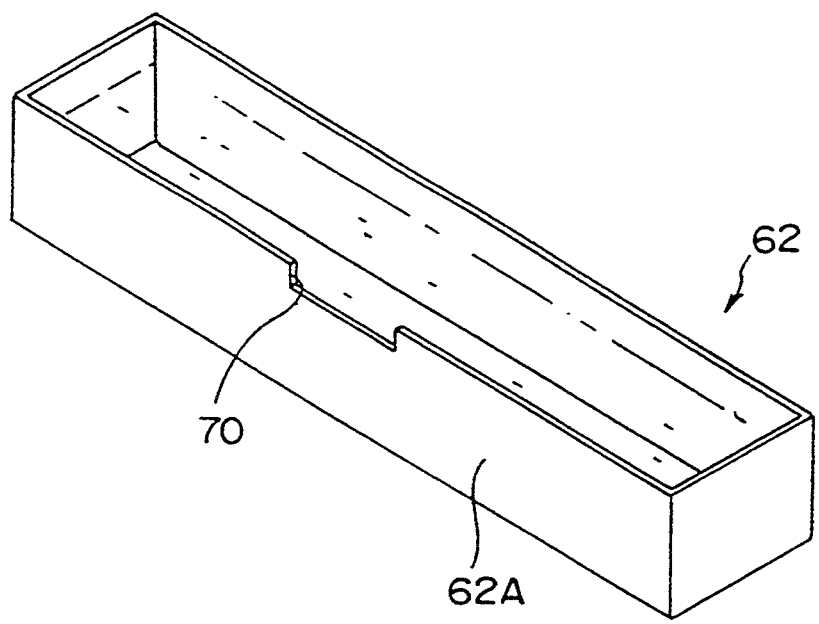
FIG. 6 is a perspective view of a pan relating to the first and second embodiments of the present invention.

As illustrated in FIG. 6, a substantially rectangular notch portion 70 is formed in a longitudinally central portion of an upstream side vertical wall portion 62A of the pan 62. Accordingly, the washing water stored in the pan 62 flows out from the notch portion 70, flows down to the washing water waste tank 28, and is discharged.

Namely, washing water flows into the pan in vicinities of both longitudinal end portions thereof, and flows out from the longitudinally central portion. Therefore, relatively new washing water (washing water which has only processed the surface of the PS plate 12) can be accumulated for a long time. Due to the washing water being drawn up by the rotation of the lower conveying roller 52, the washing water which processes the reverse surface of the PS plate 12 is returned to the pan 62 after processing. However, the washing water which is used relatively frequently for processing can quickly flow out from the notch portion 70.

As illustrated in FIG. 5, a cleaning member 72 is disposed in a bottom portion of the pan 62. The cleaning member 72 is formed by a sponge 76 (made of polypropylene) adhered to a stainless base 74. For example, Opuseru LC-300 manufactured by Hayashi Felt Co., Ltd. may be used as the sponge 76. The sponge 76 is 5 mm thick in its free state. The surface of the sponge 76 which contacts the conveying roller 52 is pressed into an arc-shape. The sponge 76 is disposed in the pan 62 such that the maximum amount that the sponge 76 is pressed is 2 mm.

The sponge 76 functions to wipe the surface of the conveying roller 52 beneath the conveying path as the conveying roller 52 rotates. Namely, the sponge 76 wipes off the developing foreign matter and the like which adhere to the reverse surface of the PS plate 12 during washing processing. Previously, although the upper conveying roller 52 could be cleaned by wiping and the like when an unillustrated cover of the casing 14 was removed, the lower conveying roller 52 could not. However, in the above-described structure of the present invention, the lower conveying roller 52 can be cleaned as processing of the PS plate 12 is being carried out.

The cleaning member 72 can be removed from the pan 62 and be replaced periodically by a new cleaning member 72.

As illustrated in FIG. 2, a pair of conveying rollers 78 is provided above the gum solution waste tank 30 of the finishing section 26. A skewer-type guide roller 80 is disposed between the conveying rollers 78 and the conveying rollers 52 at the lower side of the conveying path. The PS plate 12, which is inserted between and sent out from the conveying rollers 52, is guided by the guide roller 80 to the conveying rollers 78.

A solution supplying pipe 82 is disposed above the conveying path between the guide roller 80 and the conveying rollers 78. In the same way as the solution supplying pipe 56, discharge openings (unillustrated) which communicate with the interior of the solution supplying pipe 82 are formed therein. Gum solution is discharged from the solution supplying pipe 82 and, as will be described later, is supplied to the surface of the PS plate 12 via the surface of the conveying roller 78.

The end of a flexible blade-like member 84 slidingly contacts a portion of the outer circumference of the conveying roller 78 above the conveying path. When gum solution drips down from the solution supplying pipe 82 in a vicinity of the boundary between the blade-like member 84 and the upper conveying roller 78, the gum solution which is accumulated in a substantially V-shaped portion formed by the blade-like member 84 and the conveying roller 78 spreads toward both transverse direction end portions of the conveying roller 78. The gum solution on the surface of the conveying roller 78 above the conveying path is held to a constant thickness on the surface of the conveying roller 78 by the rotation of the conveying roller 78 and by the blade-like member 84. The liquid membrane of the gum solution is continuously transferred along the entire region of the surface of the PS plate 12 in the transverse direction thereof when the conveying roller 78 contacts the PS plate 12. As a result, the surface of the PS plate 12 can be subject to gum solution application processing with a small amount of gum solution.

The conveying rollers 78 convey the PS plate 12 interposed therebetween as well as squeeze the gum solution adhering to the surface of the PS plate 12. The gum solution squeezed from the surface of the PS plate 12 drops down from either both sides of the PS plate 12 or from the trailing end of the PS plate 12 and is recovered in the gum solution waste tank 30.

Further, the lower portion of the conveying roller 78 below the conveying path is disposed in a pan 86. A portion of the gum solution squeezed by the conveying rollers 78 drops down into and is stored in the pan 86. A portion of the lower conveying roller 78 is submerged in the gum solution stored in the pan 86. The reverse surface of the PS plate 12 is subject to application processing by the gum solution in the pan 86 being drawn up due to the rotation of the lower conveying roller 78. Accordingly, the gum solution is drawn up by the rotation of the conveying roller 78 so that the reverse surface of the PS plate 12 is subject to desensitization processing and so that drying of the upper conveying roller 78 is suppressed even when the discharge of the gum solution from the solution supplying pipe 82 is stopped when the PS plate 12 is not passing through. Therefore, the components of the processing solution do not precipitate on the surfaces of the conveying rollers 78. Further, the blade-like member 84 may contact the surface of the PS plate 12, as does the blade-like member 60.

As shown in FIG. 2, one end of piping 88 is connected to the solution supplying pipe 82. The piping 88 passes through a pump 66, and the other end of the piping 88 is disposed within a a gum solution replenishing tank 68. Fresh gum solution is stored within the gum solution replenishing tank 68. By operating the pump 66 appropriately, an appropriate amount of the gum solution can be made to drip down from the discharge openings of the solution supplying pipe 82. In the present embodiment, the discharge capacity of the pump 66 is 33 cc/m$^2$.

The operation of the present embodiment will be described hereinafter.

The PS plate 12, on which images have been recorded by an unillustrated printing device or the like, is inserted into the developing section 22 of the PS plate processor 10 from the insertion stand 16. When the PS plate 12 is inserted into the PS plate processor 10, the PS plate 12 is sent into the developing tank 18 by the conveying rollers 32.

The PS plate 12 is delivered by the conveying rollers 32 at a downward angle of 15° with respect to the horizontal direction, and is conveyed into the developing tank 18 by the guide rollers 34 and the like. At this time, while the PS plate 12 is being conveyed, developing solution is applied thereto by the spray pipes 44, 46, 48 such that the PS plate 12 undergoes developing processing.

Relatively new developing solution which is in the developing tank 18 and which is discharged from the spray pipes 44, 46, 48 furthers the developing of the PS plate 12 and removes the eluted waste matter from a vicinity of the photosensitive layer so as to promote development. The developing solution discharged from the spray pipes 44, 48 is supplied to the surfaces of the PS plate 12 from which waste matter is removed by the squeeze rollers 42. Therefore, the development of the PS plate 12 can be promoted. Thereafter, the surface of the photosensitive layer of the PS plate 12 is rubbed by the rotating brush roller 38 so that development is promoted and so that the non-image portions of the photosensitive layer are removed.

The PS plate 12, which has been subject to developing processing, is sent to the washing section 24, and is interposed between and conveyed by the conveying rollers 52. At this time, the PS plate 12 is washed by washing water discharged from the solution supplying pipe 56. Processing in the washing section 24 will be described later.

After washing processing has been completed, the PS plate 12 is guided by the guide roller 80, is sent into the finishing section 26, and is interposed between and conveyed by the conveying rollers 78. The PS plate 12 is subject to desensitization processing by the gum solution discharged from the solution supplying pipe 82. The PS plate 12 which is discharged from the finishing section 26 undergoes drying processing in the drying section 31, and is discharged from the PS plate processor 10. Processing is thereby completed.

In the finishing section 26, the blade-like member 84 contacts the circumferential surface of the upper conveying roller 78. The gum solution discharged from the solution supplying pipe 82 remains between the blade-like member 84 and the conveying roller 78 which is above the conveying path. The gum solution spreads to both transverse direction end portions, and a liquid membrane is formed on the surface of the conveying roller 78 as the conveying roller 78 rotates. This liquid membrane is transferred to the surface of the PS plate 12. Therefore, the desensitization processing of the PS plate 12 can be carried out reliably. Further, because the reverse surface of the PS plate 12 is processed by the gum solution stored in the pan 86 which is drawn up by the rotation of the lower conveying roller 78, desensitization processing of the reverse surface of the PS plate 12 is effected reliably as well.

Washing processing in the washing section 24 will now be described in detail. The end portion of the blade-like member 60 contacts the surface of the PS plate 12 which is interposed between the conveying rollers 52. As a result, a receiving portion for receiving the washing water discharged from the solution supplying pipe 56 is formed by the blade-like member 60, the surface of the PS plate 12, and the conveying roller 52 disposed above the conveying path.

Accordingly, even if there is only a small amount of washing water, the washing water can be made to accumulate on the receiving portion. Therefore, washing processing is effected with an extremely small amount of washing water discharged from the solution supplying pipe 56. In the present embodiment, three discharge holes 58 are formed in the solution supplying pipe 56 so that a small amount (approximately 33 cc/m$^2$) of washing water is supplied.

The washing water which remains in the receiving portion spreads to both transverse direction end portions of the PS plate 12. As a result, a liquid membrane is formed on the surface of the PS plate 12 so that the surface can be washed reliably. Further, the blade-like member 60 prevents the washing water from flowing backward. Therefore, the washing water does not flow into the developing section.

The washing water which reaches both transverse direction end portions of the PS plate 12 flows down from the surface of the PS plate 12 into the pan 62. The washing water flows into the pan 62 from both longitudinal direction end portions thereof.

The notch portion 70 is formed in a longitudinally central portion of the pan 62, i.e., at the position furthest from the position at which the washing water flows down from the surface of the PS plate 12). The washing water which flows down from the surface of the PS plate 12 overflows out from the notch portion 70.

The notch portion 70 is disposed within the pan 62 on the path of the flow of the solution at the furthest position from the position at which the washing water flows down into the pan 62 from both edges of the surface of the PS plate 12 after washing. Therefore, relatively new washing water does not flow out of the pan 62, but rather the washing water which has accumulated therein flows out of the pan 62. Therefore, the degree of fatigue of the washing water within the pan 62 does not increase.

The lower conveying roller 52 submerged within the pan 62 draws up the washing water within the pan 62 as the conveying roller 52 rotates so that the reverse surface of the PS plate 12 is washed. Because the washing water in the pan 62 is relatively new, the washing of the reverse surface of the PS plate 12 can be effected appropriately. The washing water, which is used to process the reverse surface and which therefore has a relatively high degree of fatigue, is returned to the pan 62, but this washing water rapidly flows out from the notch 70. Therefore, the amount of solution within the pan 62 is maintained, and relatively new washing water can accumulate therein.

Further, because the cleaning member 72 is provided at the bottom portion of the pan 62, the circumferential surface of the lower conveying roller 52 is rubbed by the sponge as the lower conveying roller 52 rotates. Therefore, dirt such as developing foreign matter and the like can be wiped from the lower conveying roller 52. Namely, because the conveying roller 52 at the lower side of the conveying path can be cleaned appropriately while processing is taking place, labor involved in removing the conveying roller 52 at the upper side of the conveying path in order to clean the lower conveying roller 52 can be eliminated. Further, because the cleaning member 72 is removable, it can be replaced periodically.

Because the upper conveying roller 52 is disposed at a position easily accessible by workers when the cover of the casing 14 is removed, there are no problems in the cleaning of the upper conveying roller 52. A cleaning member may also be disposed at the conveying roller 52 above the conveying path in the same way as the cleaning member 72 is disposed under the conveying path.

In the present embodiment, because a receiving portion of washing water is formed by the blade-like member 60, the surface of the PS plate 12, and the upper conveying roller 52, a small amount of washing water is efficiently accumulated on the surface of the PS plate 12, and a liquid membrane can be formed thereat. Therefore, the amount of washing water used can be greatly reduced. The capacity of the tank or the like in which the washing water is stored can thereby be decreased, and the entire apparatus can be made more compact.

Further, in order to process the reverse surface of the PS plate 12, relatively new washing water (i.e., washing water which has been used to process the surface of the PS plate 12) can be accumulated within the pan 62. Therefore, the ability to process the reverse surface of the PS plate 12 does not deteriorate. As a result, there is no need to provide a spray pipe or the like corresponding to the reverse surface. Accordingly, the number of parts of the apparatus can be reduced, and the workability of assembling the apparatus improves.

Further, because the cleaning member 72 is disposed within the pan 62, the lower conveying roller 52 can be cleaned during processing. The ease of maintaining the apparatus thereby improves.

In the present embodiment, the notch portion 70 is provided in the pan 62 of the washing section 28 so as to improve the circulation of the washing water. The same structure may be used in the pan 86 of the finishing section 26 so that similar efficiency can be obtained therein.

Figure 7:
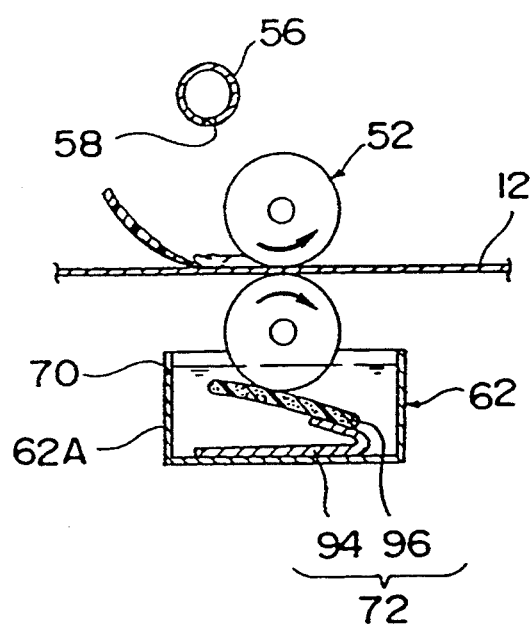
FIG. 7 is a sectional view corresponding to FIG. 5 and illustrating an example of a variation of a cleaning member relating to the first embodiment of the present invention.

Moreover, as illustrated in FIG. 7, the cleaning member 72 may be provided such that one end of a base 94 is bent in a substantially U-configuration and is made elastic. Thin felt 96 is attached to this end so that the felt 96 is pushed against the lower conveying roller 52 due to the elasticity of the end. GS felt (3 mm thick) which is manufactured by Toray Industries, Inc. can be used as the felt 96.

Next, the second embodiment of the present invention will be described. Description is omitted of parts which are the same as those of the first embodiment.

Figure 8:
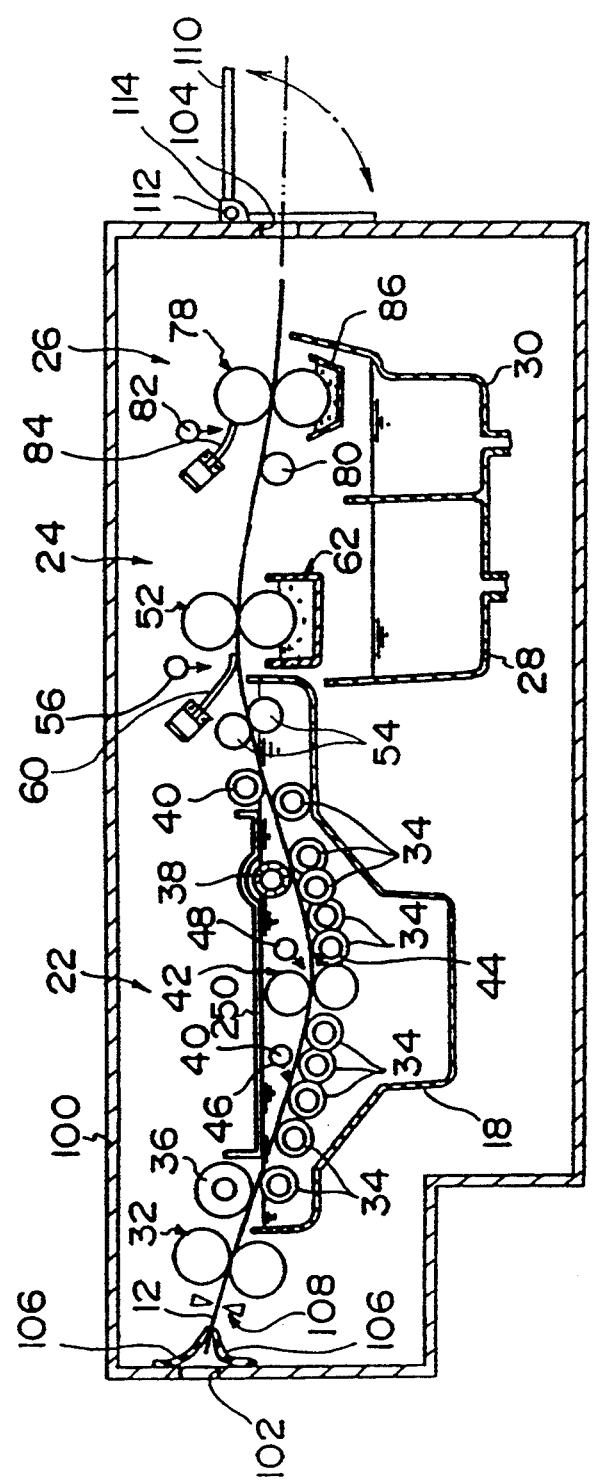
FIG. 8 is a schematic structural view of a PS plate processor relating to the second embodiment of the present invention.

As illustrated in FIG. 8, the developing section 22, the washing section 24 and the finishing section 26 are disposed in an interior portion of the casing 14. The developing section 22 includes the developing tank 18 used to subject the PS plate 12 to developing processing. In the washing section 24, developing solution adhering to the PS plate 12 is washed so that the PS plate 12 undergoes washing processing. In the finishing section 26, gum solution is applied to the washed PS plate 12 so that the PS plate 12 is subject to desensitization processing.

Figure 9:
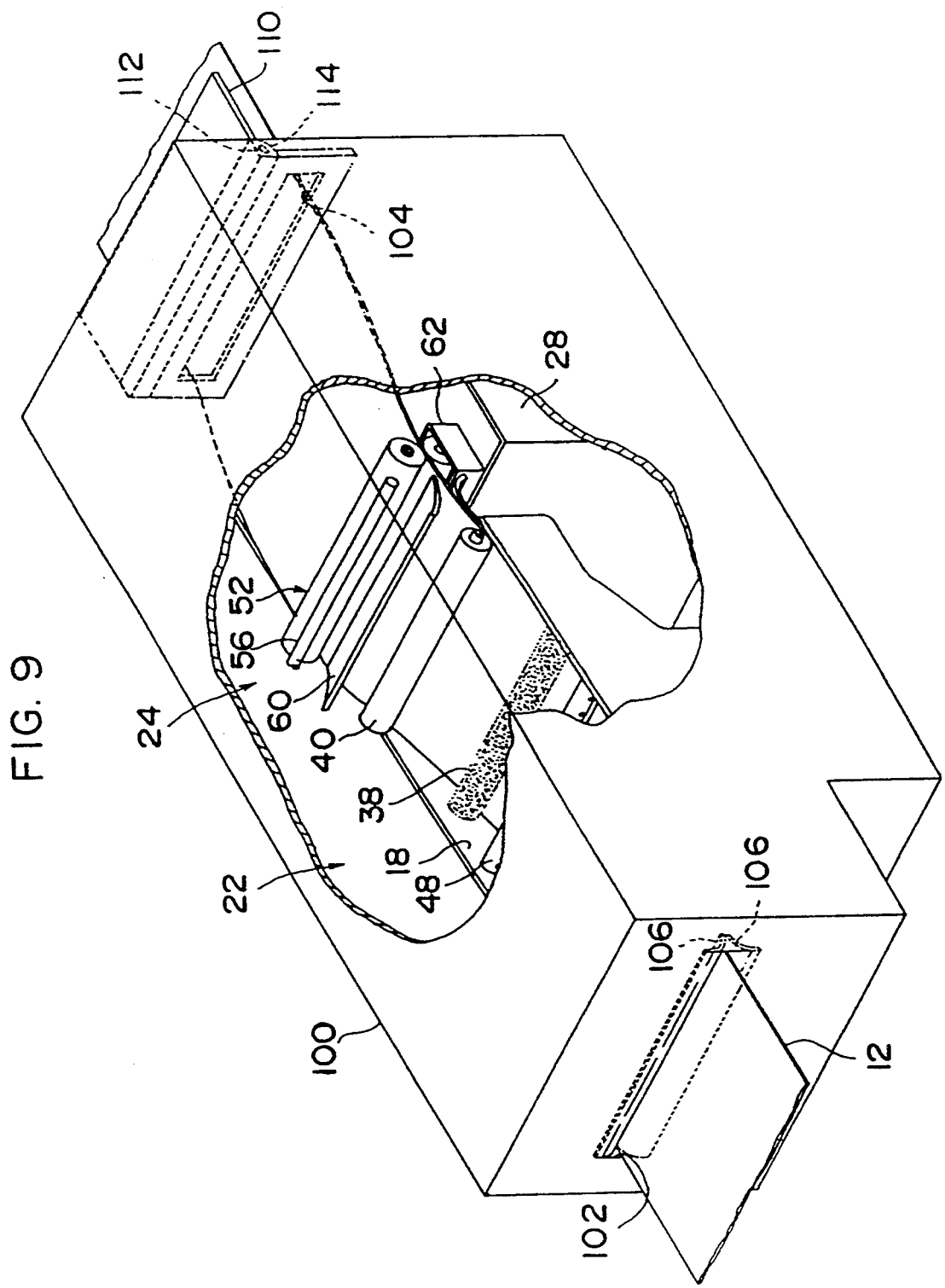
FIG. 9 is a perspective view of a casing relating to the second embodiment of the present invention.

As shown in FIGS. 8 and 9, the developing section 22, the washing section 24 and the finishing section 26 are covered by a box-type casing 100 which is separate from the casing 14. Namely, the PS processor 10 of the present embodiment has a double structure of the casing 100 and the casing 14. An insertion opening 102 and a discharge opening 104, which are both shaped as slits, are provided in the casing 100. The insertion opening 102 corresponds to an opening portion at a reverse side of the insertion stand 16. As shown in FIG. 1, the discharge opening 104 is provided so as to correspond to the entrance to the drying section 31 provided downstream of the finishing section 26. There are basically no openings in the casing 100 other than the insertion opening 102 and the discharge opening 104.

As illustrated in FIG. 8, the pair of conveying rollers 32 is disposed at the side of insertion of the PS plate 12 into the developing tank 18 of the developing section 22. The PS plate 12, on which images have been printed, is inserted between the pair of conveying rollers 32 from the insertion opening of the casing 100. The pair of conveying rollers 32 send the PS plate 12 into the developing tank 18 at an angle of 15° with respect to the horizontal direction.

A pair of rubber plates 106, whose vertical direction end portions are elastic, are attached to the inner surface of the casing 100. Respective intermediate portions of the blade-like members 106 are curved into arc-shapes. The ends of the blade-like members 106 are directed toward the downstream side in the conveying direction of the PS plate 12.

The end portions of the blade-like members 106 contact each other due to their elasticities, and close the insertion opening 102.

When the PS plate 12 is conveyed into the insertion opening 102, the pair of blade-like members 106 is opened against their respective elasticities due to the pushing force when the PS plate 12 is conveyed. As a result, the PS plate 12 can be smoothly conveyed into the casing 100.

Further, a sensor 108, which detects the existence of the PS plate 12, is provided in a vicinity of the insertion opening 102. The existence of the PS plate 12 within the casing 100 can be perceived by the sensor 108.

A floating cover 250 is disposed on the surface of the developing solution in the developing tank 18. A portion of the floating cover 250 which corresponds to the rotating brush roller 38 protrudes upward in a substantial arc-shape. The floating cover 250 floats on the surface of the developing solution so as to minimize the contact between the air and the surface of the developing solution between the guide rollers 36 and 40. Lightweight materials such as polyvinyl chloride, polyethylene, polyamide and the like can be used as the material for the floating cover 250.

An unillustrated overflow pipe is provided in the surface of the downstream side wall of the developing tank 18. When developing solution is replenished so that the developing tank 18 is filled with developing solution, the overflow of developing solution flows into the overflow pipe.

A pair of squeeze rollers 54 are disposed at the furthest downstream portion of the developing tank 18. The PS plate 12 which is discharged from the developing tank 18 is interposed between and conveyed by the squeeze rollers 54 which squeeze the developing solution from the surfaces of the PS plate 12.

Figure 10:
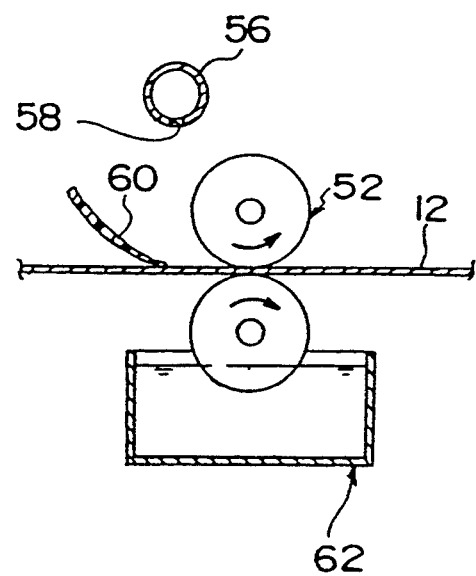
FIG. 10 is a sectional view corresponding to FIG. 5 and relating to the second embodiment of the present invention.

In the PS plate processor 10, the washing water waste tank 28 of the washing section 24 is disposed downstream of the developing section 22. As illustrated in FIGS. 3 and 10, the pair of conveying rollers 52 is disposed above the washing water waste tank 28. The conveying rollers 52 are rotatably supported to unillustrated side plates and are rotated by driving force transmitted thereto by an unillustrated driving means so as to form the conveying path of the PS plate 12 sent from the developing section 22.

In the developing section 22, the PS plate 12 is subject to developing processing. Thereafter, the PS plate 12 is subject to washing processing in the washing section 24, and then undergoes desensitization processing in the finishing section 26. After processing in the finishing section 26 is completed, the PS plate 12 passes through the discharge opening 104 of the casing 100, and is sent into the drying section 31.

A cover 110 is provided on the discharge opening 104. The cover 110 is shaped as a flat plate. One end portion of the cover 110 is fixed to a shaft 112 whose axis is parallel to the transverse direction of the PS plate 12. The shaft 112 is axially supported by a bracket 114 mounted to the upper end portion of the discharge opening 104. The cover 110 is pivotable around the shaft 112. When the cover 110 is at its vertical position, the discharge opening 104 is closed due to a spring or gravity.

The shaft 112 can be rotated by an unillustrated driving means (e.g., a solenoid). The cover 110 swings in a range of substantially 0° to 90° as the shaft 112 rotates. When the cover 110 is in its substantially horizontal state, the discharge opening 104 is open.

The rotation of the shaft 112 is based on the detection of the PS plate 12 by the sensor 108 disposed in the vicinity of the insertion opening 102. Namely, the cover 110 is maintained in its substantially horizontal state (i.e., open state of the discharge opening 104) until a predetermined period of time has elapsed from the time when the PS plate 12 is detected by the sensor 108 and then is no longer detected (i.e., after the trailing end has been detected). At other times, the cover 110 is maintained in its vertical state (i.e., closed state of the discharge opening 104).

Therefore, when the PS plate 12 passes through the discharge opening 104, there is absolutely no contact between the PS plate 12 and the cover 110.

The operation of the present embodiment will be described hereinafter.

First, when developing processing of the PS plate 12 is not being effected by the PS plate processor 10, the insertion opening 102 of the casing 100 is closed because the pair of blade-like members 106 contact each other due to their elasticities. Further, because the PS plate 12 has not been detected by the sensor 108, the cover 110 is in its vertical state so that the discharge opening 104 is closed. Therefore, the developing solution within the developing tank 18 is not exposed to the outside air, so that there is hardly any carbon dioxide fatigue. The decrease in the developing ability due to deterioration over time can thereby be suppressed. Therefore the amount of replenishing solution can be greatly decreased. In particular, the floating cover 250, which covers the surface of the developing solution within the developing tank 18, has a great effect on prohibiting contact of the developing solution and the outside air.

Next, the processing order of the PS plate 12 will be described.

The PS plate 12, on which images have been recorded by an unillustrated printing apparatus or the like, is loaded on the insertion stand 16 and sent to the back side thereof. The PS plate 12 thereby reaches the insertion opening 102 of the casing 100. Due to the pushing force of the PS plate 12 which has reached the insertion opening 102 of the casing 100, the blade-like members 106 are opened against their elasticities. As a result, the PS plate 12 is smoothly inserted into the casing 100.

When the leading end of the PS plate 12 passes through the insertion opening 102, the leading end is detected by the sensor 108. The shaft 112 is rotated so that the cover 110 of the discharge opening 104 is swung from its vertical state to its substantially horizontal state. Accordingly, the discharge opening 104 is opened. A structure may be provided in which, when the sensor 108 detects the leading end of the PS plate 12, the sensor 108 outputs a signal to a CPU so that the discharge opening is opened in accordance with appropriate timing based on the conveying speed of the PS plate 12.

The PS plate 12 which has been inserted into the casing 100 is sent to the developing section 22. When the PS plate 12 is inserted into the PS plate processor 10, the PS plate 12 is sent into the developing tank 18 by the conveying rollers 32. In the developing tank 18, the PS plate 12 is subjected to developing processing. Thereafter, the PS plate 12 is subject to washing processing in the washing section 24, and then undergoes desensitization processing in the finishing section 26.

The timing of the discharge of the washing solution from the solution supplying pipe 56 of the washing section 24 and the timing of the discharge of the gum solution from the solution supplying pipe 82 may be controlled by the CPU, in accordance with a signal signifying that the sensor 108 has detected the PS plate 12, such that the washing solution and the gum solution are discharged substantially only when the PS plate 12 passes directly under the discharge openings of the solution supplying pipe 56 and the discharge openings of the solution supplying pipe 82, respectively.

The PS plate 12 discharged from the finishing section 26 reaches the discharge opening 104 of the casing 100.

Although the cover 110 is disposed at the discharge opening 104, the shaft 112 is rotated by the detection of the PS plate 12 by the sensor 108 so that the cover 110 is placed in its substantially horizontal state. Therefore, there is no interference between the PS plate 12 passing through the discharge opening 104 and the cover 110. Accordingly, there is no rubbing of the photosensitive surface of the developed PS plate 12, and the image quality thereof can be maintained.

Further, when a predetermined amount of time passes after the trailing end of the PS plate 12 is detected by the sensor 108, the cover 110 is placed in its vertical state, i.e., the discharge opening 104 is closed. Because the time necessary for the PS plate 12 to pass through the casing 100 is constant, the cover 110 is swung and the discharge opening 104 is closed after the trailing end of the PS plate 12 has reliably passed through the discharge opening 104.

The PS plate 12 which has passed through the discharge opening 104 is subject to drying processing in the drying section 31, and is then discharged from the PS plate processor 10. Processing is thereby completed.

Further, as the object of the present invention is to keep the contact between the developing solution and the outside air to a minimum, it is preferable to keep the length of time which the cover 110 remains open to a minimum. Accordingly, it is preferable for the cover 110 to be open only when the PS plate 12 is passing therethrough, and for the cover 110 to be closed at all other times. In order to achieve this object, for example, a structure can be provided in which a sensor is provided at a vicinity of an inner side of the discharge opening 104. When leading end of the PS plate 12 is detected, the cover 110 is opened. The time necessary for the trailing end of the PS plate to be completely discharged from the discharge opening 104 is determined from the conveying speed of the PS plate. A timer is set for that amount of time so that the cover 110 is closed after the trailing end of the PS plate has completely exited from the discharge opening 104.

Moreover, the present embodiment was described using an example in which the entire automatic developing apparatus is enclosed by a casing. However, it suffices to provide a structure in which there are no openings between each of the processing tanks and in which a cover is provided so that there are no openings in the upper surfaces of all of the processing tanks. Further, a structure in which only the developing tank is covered is also effective.

Next, the third embodiment of the present invention will be described. Description is omitted of parts which are the same as those of the previously described first and second embodiments.

Figure 12:
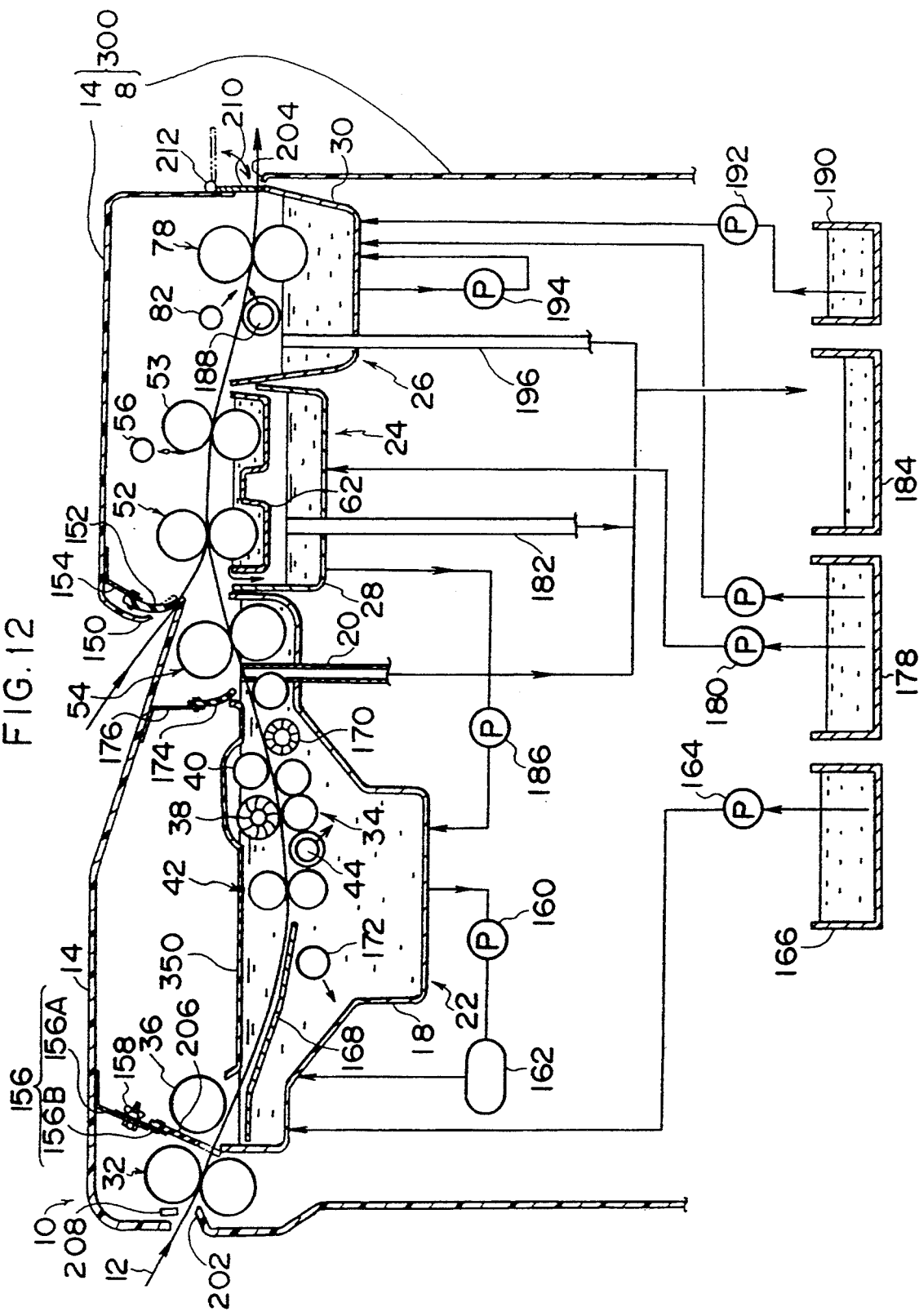
FIG. 12 is a schematic structural view of the PS plate processor relating to the third embodiment of the present invention.

As shown in FIG. 12, the developing section 22, the washing section 24 and the finishing section 26 are provided in an interior portion of a casing 14. The developing section 22 includes the developing tank 18 used for developing processing the PS plate 12, and the overflow pipe 20 which recovers the developing solution which overflows from the developing tank 18. In the washing section 24, the developing solution adhering to the PS plate 12 is washed off as the PS plate 12 is subject to washing processing. In the finishing section 26, gum solution is applied to the washed PS plate 12 so that the PS plate 12 undergoes desensitization processing.

Figure 11:
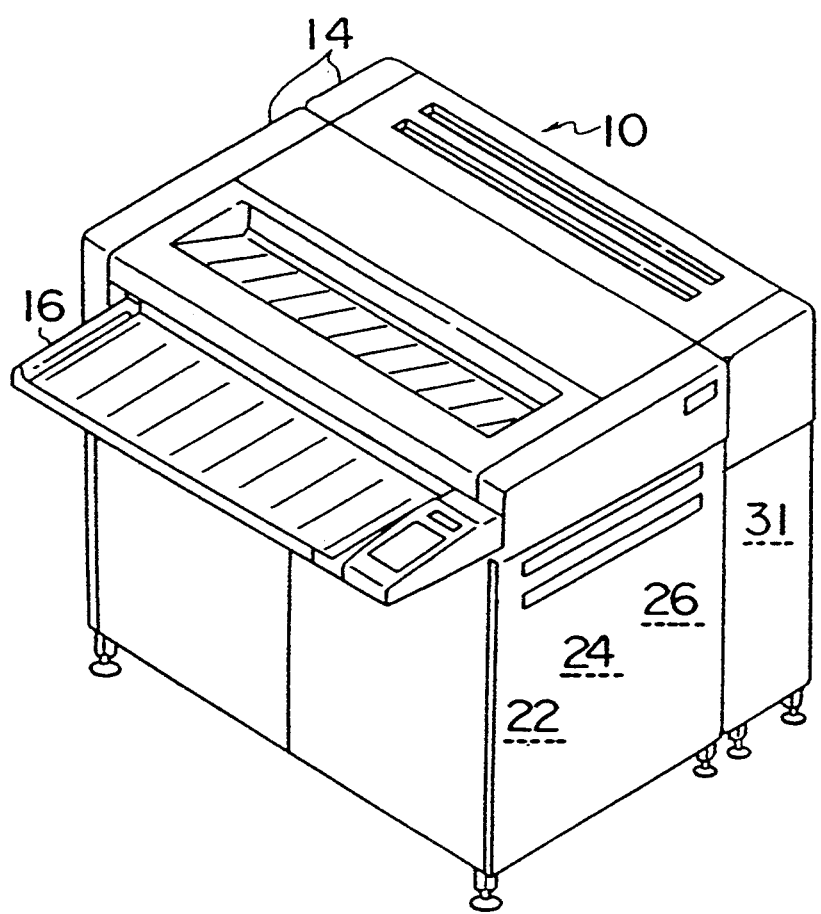
FIG. 11 is a perspective view of a PS plate processor relating to a third embodiment of the present invention.

An insertion opening 202 and a discharge opening 204, which are both slit-shaped, are provided in the casing 14. The insertion opening 202 is provided so as to correspond to a reverse side opening of the insertion stand 16. As shown in FIG. 11, the discharge opening 204 is provided so as to correspond to the entrance of the drying section 31 provided downstream of the finishing section 26.

A re-entry insertion opening (hereinafter, "auxiliary insertion opening") 150 is provided in the upper surface of the casing 14 between the developing section 22 and the washing section 24. The PS plate 12 which is to be subject to processes other than developing processing is inserted into the auxiliary insertion opening 150.

A blade-like member 152, serving as a partitioning plate, is disposed at the auxiliary insertion opening 150. The blade-like member 152 is made of rubber, and the end portion thereof contacts the casing 14 which is a guiding support surface of the auxiliary insertion opening 150. The base portion of the blade-like member 152 is fixed to the reverse surface of the casing 14 via a bracket 154. The auxiliary insertion opening 150 is closed by the blade-like member 152. When a PS plate 12 is inserted from the auxiliary insertion opening 150, the blade-like member 152 elastically deforms so that the insertion of the PS plate 12 is not obstructed.

As illustrated in FIG. 12, the pair of conveying rollers 32 is disposed at the side of insertion of the PS plate 12 into the developing tank 18 of the developing section 22. The PS plate 12, on which images have been printed, is inserted between the pair of conveying rollers 32 from the insertion opening 202. The pair of conveying rollers 32 send the PS plate 12 into the developing tank 18 downward at an angle of 15° with respect to the horizontal direction.

A rubber blade-like member 206 is provided in a vicinity of the downstream side of the conveying rollers 32. The end portion of the blade-like member 206 contacts the side wall of the developing tank 18 of the developing section 22. The base portion of the blade-like member 206 is attached to the casing 14 via a bracket 156. The bracket 156 is formed by a fixed portion 156A and a slide portion 156B which is attached to the fixed portion 156A by a wing nut 158. The blade-like member 206 is fixed to the slide portion 156B. By loosening the wing nut 158 so that the slide portion 156B is slid with respect to the fixed portion 156A, the end portion of the blade-like member 206 can be moved away from the side wall of the developing tank 18.

The end portion of the blade-like member 206 usually contacts the side wall of the developing tank 18. When the PS plate 12 is conveyed into the insertion opening 202, the blade-like member 206 is opened against the elasticity thereof due to the pushing force of the PS plate 12 which is conveyed. Therefore, the PS plate 12 can be smoothly conveyed into the developing section 22.

A sensor 208 which detects the existence of the PS plate 12 is provided in a vicinity of the insertion opening 202. The existence of the PS plate 12 within the apparatus can be perceived by the sensor 208.

The top of the developing tank 18 is open, and a central portion of the bottom portion thereof projects downward in a substantially rectangular shape. A pump 160 is provided in a vicinity of the developing tank 18. Developing solution within the developing tank 18 is sucked therefrom by the pump 160, and is sprayed by spray pipes 44, 172 to be described later. The developing solution stored within the developing tank 18 is thereby circulated. As the developing solution circulates, it passes through a measuring instrument 162 which measures the degree of fatigue of the developing solution (the impedance of the alternating current of the developing solution) so as to determine the degree of fatigue of the developing solution. Further, replenishing solution is supplied to the developing tank 18 from a developing replenishing solution tank 166 via a pump 164.

A guide plate 168 is provided within the developing tank 18 in the upstream side thereof. The plurality of guide rollers 34 and a rotating brush roller 170 are provided in a downstream side of the developing tank 18. The guide rollers 34 and the rotating brush roller 170 are rotatably suspended between a pair of side plates of the developing tank 18.

The relatively large diameter guide roller 36 is disposed above the guide plate 168. The rotating brush roller 38 and the guide roller 40 are disposed above the guide rollers 34. The guide rollers 36, 40 and the rotating brush roller 38 are rotatably supported between the pair of side plates of the developing tank 18.

The pair of squeeze rollers 42, the plurality of guide rollers 34 adjacent to the squeeze rollers 42, and the guide plate 168 are disposed so as to convey the PS plate 12 at a radius of curvature of 300 to 350 mm at a vicinity of the bottom portion of the developing tank 18. Accordingly, the PS plate 12, which is interposed between and conveyed by the pair of conveying rollers 32 and is inserted into the developing tank 18, is conveyed so as to pass between the guide plate 168 and the guide roller 36 at an incline. The PS plate 12 is then inserted between the squeeze rollers 42. The squeeze rollers 42 remove waste matter, which is eluted in the developing solution, from the photosensitive layer side (the upper side in FIG. 12) of the PS plate 12 so that the waste matter is not conveyed downstream with the movement of the PS plate 12.

The spray pipe 44, which is located next to the squeeze rollers 42 on the downstream side thereof, is formed as a skewer-type roller having a plurality of elastic rotating members supported axially on the outer circumference of the shaft of the spray pipe 44. The spray pipe 44 functions to guide the PS plate 12. Discharge openings (unillustrated) which communicate the outer circumference and the interior of the spray pipe 44 are provided in the spray pipe 44 between the elastic rotating members. Further, a spray pipe 172 is provided beneath the guide plate 168. A plurality of unillustrated discharge openings communicating with the inner portion of a hollow pipe in the spray pipe 172 are formed in the outer circumferential surface of the spray pipe 172 along the axial direction thereof. The axial direction of the spray pipe 172 is the transverse direction of the conveying path. The spray pipe 172 and the spray pipe 44 discharge developing solution to the bottom surface of the developing tank 18 so that new developing solution can quickly diffuse throughout the entire developing tank 18.

The overflow pipe 20 is provided at the furthest downstream portion of the developing tank 18. When the liquid surface of the developing solution exceeds a predetermined level, the developing solution is guided by the overflow pipe 20 to a waste solution tank 184, and is disposed of.

A floating cover 350 is disposed on the surface of the developing solution within the developing tank 18. A portion of the floating cover 350 corresponding to the rotating brush roller 38 and the guide roller 40 located adjacent thereto protrudes in a substantial arc-shape. The surface of the developing solution is covered so that the contact between the surface of the developing solution and the air is kept to the minimum possible. Both ends of the floating cover 350 in the conveying direction of the PS plate 12 are attached to unillustrated side plates by a slidable structure so that the floating cover 350 moves vertically in accordance with fluctuations in the level of the developing solution. A lightweight material such as polyvinyl chloride, polyethylene, polyamide or the like may be used for the material of the floating cover 350.

An end of a blade-like member 174 contacts the downstream side end of the floating cover 350. The blade-like member 174 is made of rubber and is fixed to the casing 14 via a bracket 176. The liquid surface of the developing solution, which is exposed from the downstream end of the floating cover 350, and the region above the floating cover 350 are separated by the blade-like member 174. The region above the floating cover 350 is completely separated from the outside air by the blade-like member 174 and the blade-like member 206 in the vicinity of the insertion opening 202 (when the blade-like member 206 contacts the side wall of the developing tank 18). Evaporation of the developing solution can be suppressed, and fatigue ($CO_2$ fatigue) due to the developing solution being exposed to the outside air can be reduced greatly.

In the PS plate processor 10, the washing water waste tank 28 of the washing section 24 is disposed at the downstream side of the developing section 22. Two pairs of conveying rollers 52, 53 are provided above the washing water waste tank 28. The conveying rollers 52, 53 are rotatably supported to unillustrated side plates and are rotated by driving force transmitted thereto from an unillustrated driving means so as to form the conveying path of the PS plate 12 sent from the developing section 22.

Washing water, which has washed the developing solution off of the PS plate 12 which has been sent out from the developing tank 18, accumulates within the washing water waste tank 28. The solution supplying pipe 56 is disposed at an upstream side of the conveying rollers 53 and above the conveying path. A plurality of discharge holes which communicate with the interior portion of the solution supplying pipe 56 are provided in the outer circumference of the solution supplying pipe 56. Washing water which is drawn up from a washing water tank 178 by a pump 180 drips down from the solution supplying pipe 56 onto the conveying roller 53 above the conveying path. As the conveying rollers 53 rotate, the washing water quickly spreads on the surface of the PS plate 12 so that the surface of the PS plate 12 is washed by the washing water.

Further, lower portions of the lower conveying rollers 52, 53 are accommodated within the pan 62. Washing water is stored within the pan 62 and is drawn up by the rotation of the conveying rollers 52, 53 under the conveying path. The reverse surface of the PS plate 12 is washed, and drying of the upper conveying rollers 52, 53 is suppressed.

The main effect of the conveying rollers 52 is to increase the developing efficiency of the reverse surface of the PS plate 12. However, the conveying rollers 52 also ensure stability of conveying the PS plate 12 and prevent washing water supplied to the surface of the PS plate 12 from flowing backward toward the upstream side in the conveying direction of the PS plate 12.

Further, the washing water which disperses on the surface of the PS plate 12 in the transverse direction thereof flows downward from both transverse direction end portions of the PS plate 12 into the pan 62. The reverse surface of the PS plate 12 undergoes washing processing by the washing water drawn up from the pan 62 by the conveying rollers 52, 53 located under the conveying path. The washing water which overflows from the pan 62 is guided to the washing water waste tank 28. An overflow pipe 182 is disposed in the washing water waste tank 28 so that when the liquid surface exceeds a predetermined level, the washing water is discharged to the disposal tank 184.

Figure 13:
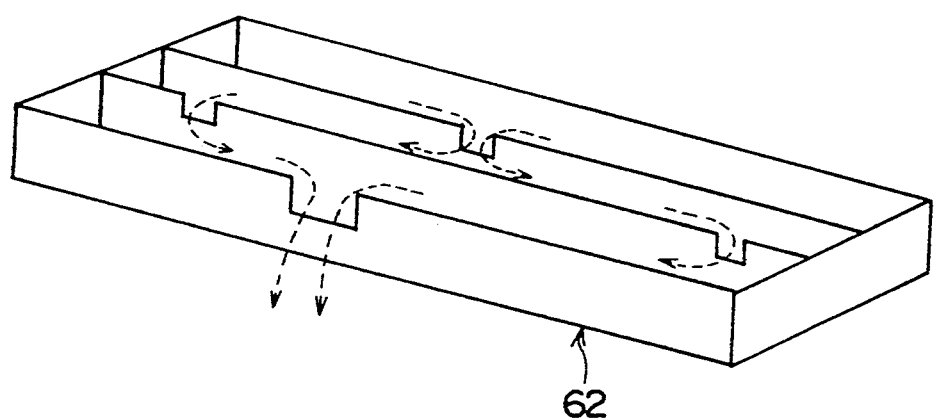
FIG. 13 is a perspective view illustrating a variation of a pan related to the third embodiment of the present invention.

As illustrated in FIG. 13, the pan 62 may be structured such that the length of the flow path of new washing water is made as long as possible so that the greatest washing efficiency can be obtained.

Further, the washing water waste tank 28 and the developing tank 18 are communicated via a pump 186. By driving the pump 186, the washing water within the washing water waste tank 28 is guided to the developing tank 18 so that the washing water can be used as diluted solution when replenishing solution is supplied to the developing tank 18.

As illustrated in FIG. 12, the pair of conveying rollers 78 is provided above the gum solution waste tank 30 of the finishing section 26, which is a desensitization processing section. The PS plate 12 sent out by the transport rollers 53 is guided to the conveying rollers 78.

Spray pipes 82, 188 are disposed upstream of the conveying rollers 78 in the vertical direction of the conveying path. The spray pipe 188 beneath the conveying path is formed as a skewer-type roller, and serves to guide the PS plate 12. In the same way as the solution supplying pipe 56, discharge openings (unillustrated) are formed in the solution supplying pipe 82 and the spray pipe 188 so as to communicate with the respective inner portions of the solution supplying pipe 82 and the spray pipe 188. Gum solution drawn up from a gum solution tank 190 by a pump 192 is discharged from the solution supplying pipe 82 and the spray pipe 188, and is supplied to the surfaces of the PS plate 12.

The gum solution in the gum solution tank 30 is circulated by the pump 194. An overflow pipe 196 is provided in the gum solution waste tank 30 so that when the liquid surface of the gum solution exceeds a predetermined level, the gum solution is guided to the waste solution tank 184 and is disposed of.

The PS plate 12, for which processing in the finishing section 26 has been completed, passes through the discharge opening 204 of the casing 14 and is sent to the drying section 31. A cover 210 serving as a partition plate is provided at the discharge opening 204. The cover 210 is shaped as a flat plate, and the top end portion thereof is fixed to a shaft 212 which is parallel to the transverse direction of the PS plate 12. The cover 210 is pivotable around the shaft 212. When the cover 210 is in its vertical position, the discharge opening 204 is closed by a spring or by gravity.

The shaft 212 is rotatable by an unillustrated driving means (e.g., a solenoid). The cover 210 swings in a range of substantially 0° to 90° as the shaft 212 rotates. When the cover 210 is in its substantially horizontal position, the discharge opening 204 is open.

The rotation of the shaft 212 is based on the detection of the PS plate 12 by the sensor 208 disposed in the vicinity of the insertion opening 202. Namely, the cover 210 is maintained in its substantially horizontal state (i.e., open state of the discharge opening 204) until a predetermined period of time has elapsed from the time when the PS plate 12 is detected by the sensor 208 and then is no longer detected (i.e., after the trailing end has been detected). At other times, the cover 210 is maintained in its vertical state (i.e., closed state of the discharge opening 204).

Therefore, when the PS plate 12 passes through the discharge opening 204, there is absolutely no contact between the PS plate 12 and the cover 210.

The operation of the present embodiment will be described hereinafter.

The processing tanks, such as the developing tank 18, the washing water waste tank 28, the gum solution waste tank 30 and the like, are covered by a casing 300 which is formed by the casing 14, a main body 8, and the like. When developing processing of the PS plate 12 is not being effected, the insertion opening 202 is closed because the blade-like member 206 contacts the side wall of the developing tank 18. Further, in this state, because the PS plate 12 has not been detected by the sensor 208, the cover 210 is kept in its vertical state so that the discharge opening 204 is closed as well. Further, the auxiliary insertion opening 150 is closed by the blade-like member 152 so that the region of the developing section 22 above the floating cover 350 is closed by the blade-like members 206, 174. As a result, the developing solution within the developing tank 18, the washing water within the washing section 24, and the gum solution within the finishing section 26 are not exposed to the outside air so that evaporation of the processing solutions can be suppressed and $CO_2$ fatigue can be almost completely eliminated. As a result, the decrease in the developing ability due to deterioration over time can thereby be suppressed. Therefore, for example, the amount of replenishing solution replenished to the developing section 22 can be greatly decreased. In particular, the floating cover 350, which covers the surface of the developing solution within the developing tank 18, has a great effect on prohibiting contact of the developing solution and the outside air.

Because the slide portion 156B is slidable when the wing nut 158 is loosened, the blade-like member 206 of the insertion opening 202 becomes movable and can be opened as occasion demands. For example, when it is desirable to increase the amount of the replenishing solution to be replenished, if the blade-like member 206 is opened a certain extent, the replenishing interval can be made shorter compared to the replenishing interval when the developing tank 18 is closed. The amount of replenishing solution can thereby be increased.

Further, a structure may be provided in which an unillustrated blade-like member having the same structure as the blade-like member 174 and the blade-like member 206 is provided between the developing tank 18 and the washing water waste tank 28 or between the washing water waste tank 28 and the gum solution waste tank 30. By loosening the wing nut in the same way as that of the blade-like member 206, the slide portion becomes slidable, and the blade-like member can be opened as occasion demands.

Next, the order of processing the PS plate 12 will be described.

The PS plate 12 inserted into the casing 300 is first sent into the developing section 22. When the PS plate 12 is inserted into the PS plate processor 10, the PS plate 12 is sent into the developing tank 18 by the conveying rollers 32. The pushing force of the PS plate 12 conveyed by the conveying rollers 32 opens the blade-like member 206 against the elasticity thereof. As a result, the PS plate 12 is conveyed smoothly into the developing section 22.

The PS plate 12 is guided by the guide plate 168 downward at an angle of 15° to the horizontal direction, and is conveyed into the developing tank 18 by the guide rollers 34 and the like.

Thereafter, the photosensitive layer side surface of the PS plate 12 is rubbed by the rotating brush roller 38 so that developing is promoted. The photosensitive layer of the non-image portions is removed.

The PS plate 12 which has undergone developing processing is sent to the washing section 24 and interposed between and conveyed by the conveying rollers 52, 53. At this time, the surface of the PS plate 12 is washed by new washing water which drips down onto the upper conveying roller 53 from the solution supplying pipe 56. The reverse surface of the PS plate 12 is washed by washing water which is drawn up from the pan 62 by the lower conveying roller 53.

Namely, the washing water which drips from the solution supplying pipe 56 spreads to both transverse direction end portions of the PS plate 12 and flows down from the surface of the PS plate 12 into the pan 62. The washing water flows into the pan 62 from both transverse direction end portions of the PS plate 12. The lower rollers of the conveying rollers 52, 53 which are submerged in the pan 62 draw up washing water within the pan 62 as the lower conveying rollers 52, 53 rotate. The reverse surface side of the PS plate 12 is thereby washed.

The washing water which overflows from the pan 62 is guided to the washing water waste tank 28. When the washing water within the washing water waste tank 28 exceeds a predetermined amount, the washing water is sent through the overflow pipe 182 to the waste solution tank 184. Most of the washing water is supplied to the developing tank 18 by a pump 186.

By the operation of the pump 164, replenishing solution is supplied to the developing tank 18 from the developing replenishing solution tank 166 in accordance with the amount of the PS plate 12 processed and the like. The washing water in the washing water waste tank 28 is used as diluted solution in a predetermined ratio to the amount of replenishing solution replenished to the developing tank 18. In this way, the washing water which has been used for washing processing in the washing section 24 can be used effectively, and the amount of waste solution can be reduced.

After washing processing has been completed, the PS plate 12 is sent to the finishing section 26, which is a desensitization processing section. The PS plate 12 is interposed between and conveyed by the conveying rollers 78. Desensitization processing is effected by gum solution which is discharged from the solution supplying pipe 82 and the spray pipe 188.

The PS plate 12 which is discharged from the finishing section 26 reaches the discharge opening 204 of the casing 300.

The cover 210 is provided at the discharge opening 204. The shaft 212 is rotated by the detection of the PS plate 12 by the sensor 208 so that the cover is placed in its substantially horizontal state. Therefore, there is no interference between the PS plate 12 which passes through the discharge opening 204 and the cover 210. Accordingly, the photosensitive surface of the developed PS plate 12 is not rubbed, and the quality of the surface of the PS plate 12 can be maintained.

Further, when a predetermined amount of time passes after the sensor 208 detects the trailing end of the PS plate 12, the cover is placed in its vertical state, i.e., the discharge opening 204 is closed. Because the time necessary for the PS plate 12 to pass through the interior of the casing 300 is constant, the cover 210 is swung and the discharge opening 204 is closed after the trailing end of the PS plate 12 has reliably exited from the discharge opening.

The PS plate 12 which passes through the discharge opening 204 is subject to drying processing in the drying section 31. The PS plate 12 is then discharged from the PS plate processor 10, and processing is completed.

Further, as the object of the present invention is to keep the contact between the developing solution and the outside air to a minimum, it is preferable to keep the length of time which the cover 210 remains open to a minimum. Accordingly, it is preferable for the cover 210 to be open only when the PS plate 12 is passing therethrough, and for the cover 210 to be closed at all other times. In order to achieve this object, for example, a structure can be provided in which a sensor is provided at a vicinity of an inner side of the discharge opening. When the leading end of the PS plate 12 is detected, the cover 210 is opened. The time necessary for the trailing end of the PS plate to be completely discharged from the discharge opening is determined from the conveying speed of the PS plate. A timer is set to close the cover 110 after that amount of time.

In the present embodiment, in the washing section 24, the washing water is stored in a large tank. Rather than using a circulation type-system, in the present embodiment, the minimum amount of washing water necessary drips down, and the subsequent disposal system is also a non-circulating type. Therefore, the washing water waste tank 28 can be made relatively compact. Further, because there is no need for a circulating pump, piping and the like, the entire apparatus can be made more compact. The present embodiment also eliminates drawbacks which arise in circulation-type systems. Such drawbacks include precipitate, which forms on the rollers and on the walls and the like of the processing tanks, falling into the processing solutions and closing off the discharge openings of the spray pipes which discharge the processing solutions. This drawback is caused by evaporation of the processing solutions from a large processing tank used for accumulating and circulating the processing solutions which flow down therein after processing of the PS plate 12. As such a drawback is eliminated in the present embodiment, the maintainability of the apparatus can be improved. Further, in the present embodiment, the total amount of waste solution is 25 to 100 cc/m$^2$ per day regardless of the processing area. This is a large decrease compared with conventional apparatuses in which the total amount of waste solution is 150 to 500 cc/m$^2$ per day.

The developing section 22 is separated from other sections by the blade-like members 206, 174. The blade-like member 152 and the cover 210 are provided at the auxiliary insertion opening 150 and the discharge opening 204, respectively. Therefore, the interior of the apparatus can be partitioned into several block, and deterioration of the processing solutions due to contact with the outside air can be greatly suppressed. Because evaporation of the processing solutions can be greatly suppressed, the amount of replenishing solution can be reduced, and stable processing can be effected.

Further, cleaning plates (about 1 to 3 plates) which are necessary when operation begins in conventional processing apparatuses are not needed in the apparatus of the present embodiment. Workability is thereby improved.

The finishing section 26 of the present embodiment is structured such that no .pan is provided, and the lower conveying roller 78 is submerged directly in the gum solution waste tank 30. However, a pan may be provided in the same way as in the washing section 24. The finishing section may also be structured as a non-circulating system in accordance with the processing capability of the gum solution.

Moreover, in the present embodiment, the developing section 22 is considered as one block, and the washing section 24 and the finishing section 26 are considered as another block. These blocks are partitioned by the blade-like members 206, 152, 174 and the cover 210. However, the developing section 22, the washing section 24 and the finishing section 26 may be considered as one block so that the blade-like member 174 is not provided. Further, the developing section 22, the washing section 24 and the finishing section 26 may be considered as independent, respective blocks, and the blade-like members may be provided between each of these blocks. If the processing solutions used are extremely resistant to fatigue caused by air, the partitions between the blocks may be eliminated al together.

In the present embodiment, computer control is effected to determine the timing of the replenishing of the developing replenishing solution based on the results of measurement by the measuring instrument 162. Therefore, printing plates which have screen ruling of 400 to 700 lines/inch and which are used for high precision printing can be processed stably. However, if only conventional precision is required (150 to 170 lines/inch), computer control can be omitted.

What is claimed is:

1. A sheet-like material processing apparatus in which while a sheet-like material is interposed between and conveyed by a pair of rollers, excess processing solution is squeezed out from the sheet-like material, and the sheet-like material is processed, comprising:

a solution supplying device provided at an upstream side of said pair of rollers for dripping the processing solution;

processing solution limiting means provided at an upstream side of said pair of rollers for limiting movement of the processing solution toward the upstream side, and for accumulating the processing solution by said pair of rollers and said processing solution limiting means;

a processing solution accumulating member receiving and accumulating the processing solution which flows down from transverse direction ends of the sheet-like material and in which only one of said pair of rollers which is located at a lower side of a conveying path of the sheet-like material is submerged; and a flow-out portion provided at a central portion corresponding to transverse direction ends of the sheet-like material, on a vertical wall of said accumulating member, for letting excess processing solution within said accumulating member flow out.

2. A sheet-like material processing apparatus according to claim 1, wherein said processing solution accumulating member has a cleaning member contacting a circumferential surface of said lower roller.

3. A sheet-like material processing apparatus in which while a sheet-like material is interposed between and conveyed by a pair of rollers, excess processing solution is squeezed out from the sheet-like material, and the sheet-like material is processed, comprising:

a solution supplying device provided at an upstream side of said pair of rollers for dripping the processing solution; and processing solution limiting means provided at an upstream side of said pair of rollers for limiting movement of the processing solution toward the upstream side, and for accumulating the processing solution by said pair of rollers and said solution limiting means, wherein said processing solution limiting means is a blade-like member, a tip end portion of said blade-like member being disposed on a locus of movement of the sheet-like material, and said blade-like member preventing the processing solution which is dripped from said solution supplying device and which is accumulated on the sheet-like material, from flowing backward to an upstream side on the sheet-like material.

4. A sheet-like material processing apparatus in which while a sheet-like material is interposed between and conveyed by a pair of rollers, excess processing solution is squeezed out from the sheet-like material, and the sheet-like material is processed, comprising:

a solution supplying device provided at an upstream side of said pair of rollers for dripping the processing solution; and processing solution limiting means provided at an upstream side of said pair of rollers for limiting movement of the processing solution toward the upstream side, and for accumulating the processing solution by said pair of rollers and said processing solution limiting means, wherein said processing means is a blade-like member, a tip end portion of said blade-like member being disposed on a locus of movement of the sheet-like material, and said blade-like member preventing the processing solution which is dripped from said solution supplying device and which is accumulated on the sheet-like material, from flowing backward to an upstream side on the sheet-like material, said sheet-like material processing apparatus further comprising:

a processing solution accumulating member receiving and accumulating the processing solution which flows down from transverse direction ends of the sheet-like material and in which only a lower roller of said pair of rollers which is located at a lower side of a conveying path of the sheet-like material is submerged; and a flow-out portion provided at a central portion corresponding to transverse direction ends of the sheet-like material, on a vertical wall of said processing solution accumulating member, for letting excess processing solution within said processing solution accumulating member flow out from said flow-out portion.

5. A sheet-like material processing apparatus according to claim 1, wherein said processing solution limiting means is a blade-like member, said blade-like member being provided at an upstream side of said pair of rollers, a tip end portion of said blade-like member being disposed so as to contact a circumferential surface of a roller of said pair of rollers which is located at an upper side of a conveying path of the sheet-like material, and said blade-like member accumulating the processing solution dripped from a solution supplying device.

6. A sheet-like material processing apparatus in which while a sheet-like material is interposed between and conveyed by a pair of rollers, excess processing solution is squeezed out from the sheet-like material, and the sheet-like material is processed, comprising:

a solution supplying device provided at an upstream side of said pair of rollers for dripping the processing solution; and processing solution limiting means provided at an upstream side of said pair of rollers for limiting movement of the processing solution toward the upstream side, and for accumulating the processing solution by said pair of rollers and said processing solution limiting means, wherein said processing solution limiting means is a blade-like member, said blade-like member being provided at an upstream side of said pair of rollers, a tap end portion of said blade-like member being disposed so as to contact a circumferential surface of a roller of said pair of rollers which is located at an upper side of a conveying path of the sheet-like material, and said blade-like member accumulating the processing solution which is dripped from a solution supplying device, said sheet-like material processing apparatus further comprising:

a processing solution accumulating member receiving and accumulating the processing solution which flows down from transverse direction ends of the sheet-like material and in which only a part of one of said pair of rollers which is located at a lower side of a conveying path of the sheet-like material is submerged in the processing solution; and a flow-out portion provided at a central portion corresponding to transverse direction ends of the sheet-like material, of a vertical wall provided at said processing solution accumulating member, for letting excess processing solution within said processing solution accumulating member flow out.

7. A sheet-like material processing apparatus for squeezing out excess processing solution from a sheet-like material and for processing the sheet-like material by the processing solution while the sheet-like material is interposed between, contacted, and conveyed by a pair of rollers, comprising:

a pan accumulating the processing solution in which only one of said pair of rollers which is located at a lower side of a conveying path of the sheet-like material is submerged in the processing solution; and a cleaning member accommodated in said pan and contacting a circumferential surface of said roller which is located at the lower side of the conveying path of the sheet-like material.

8. An automatic developing apparatus for photosensitive lithographic printing plates in which the photosensitive lithographic printing plates are conveyed through developing solution in a developing tank so that the photosensitive lithographic printing plates are developed, the photosensitive lithographic printing plates being subject to washing by washing water and to desensitization by gum solution and being dried, said automatic developing apparatus comprising:

a casing which prevents at least said developing tank from being exposed to outside, said casing having an insertion opening through which the photosensitive lithographic printing plates are inserted and a discharge opening through which the photosensitive lithographic printing plates are discharged;

a first cover provided at and usually closing said insertion opening of said casing, and being opened so that the photosensitive lithographic printing plates are insertable when the photosensitive lithographic printing plates are inserted and said first cover is pushed by the photosensitive lithographic printing plates; and a second cover provided at and usually closing said, discharge opening of said casing, and being opened so that the photosensitive lithographic printing plates are dischargeable without contacting said second cover when the photosensitive lithographic printing plates are discharged from said casing.

9. An automatic developing apparatus according to claim 6, further comprising:

a surface cover covering and contacting the surface of the developing solution accumulated in said developing tank and isolating the developing solution from air.

10. An automatic developing apparatus according to claim 8, in which the photosensitive lithographic printing plates are processed while the photosensitive lithographic printing plates are interposed between and conveyed by a pair of rollers, for squeezing out excess processing solution from the photosensitive lithographic printing plates, further comprising:

a solution supplying device provided at an upstream side of said pair of rollers and dripping the processing solution; and processing solution limiting means provided at an upstream side of said solution supplying device and limiting movement of the processing solution, said processing solution being accumulated by said pair of rollers and the processing solution limiting means.

11. An automatic developing apparatus for processing photosensitive lithographic printing plates, comprising:

a developing section, one of processing sections of said automatic developing apparatus in which a photosensitive lithographic printing plate is processed by developing solution while being conveyed;

a rinsing section for rinsing a photosensitive lithographic printing plate by supplying rinsing solution to both surfaces of the photosensitive lithographic printing plate while the photosensitive lithographic printing plate is being conveyed, the rinsing solution being dripped onto an upper surface of the photosensitive lithographic printing plate, the rinsing solution which flows down from the upper surface being accumulated for supplying to an under surface of the printing plate, and the rinsing solution being discharged; and a casing for enclosing a processing region of the photosensitive lithographic printing plate including at least one of said developing section and said rinsing section to prevent said at least one of the developing solution and the rinsing solution from being exposed to outside, said casing having an insertion opening through which the photosensitive lithographic printing plate is inserted into said casing and a discharge opening through which the photosensitive lithographic printing plate is discharged from said casing.

12. An automatic developing apparatus according to claim 11, wherein the rinsing solution is water, and the water which has been used for rinsing is supplied from said rinsing section to said developing section as diluting solution for replenishing solution developing agent.

13. An automatic developing apparatus according to claim 11, further comprising:

partitioning plates dividing said processing region into each processing section or blocks containing some processing sections, and partitioning said blocks without interfering with a passing of the photosensitive lithographic printing plate.

14. An automatic developing apparatus according to claim 13, wherein when the photosensitive lithographic printing plate passes through said discharge opening, one of said partitioning plates which is provided at said discharge opening withdraws from its shielding position to a position at which said one of said partitioning plates does not contact the photosensitive lithographic printing plate.

15. An automatic developing apparatus for photosensitive lithographic printing plates in which a photosensitive lithographic printing plate is conveyed to pass through at least one of a developing section and a rinsing section, which are processing sections to process the photosensitive lithographic printing plate, said automatic developing apparatus comprising:

a casing enclosing a processing region of the photosensitive lithographic printing plate including at least one of said processing sections for preventing at least one of processing solutions from being exposed to outside, said casing having an insertion opening through which the photosensitive lithographic printing plate is inserted and a discharge opening through which the photosensitive lithographic printing plate is discharged;

partitioning plates dividing said processing region into one of blocks corresponding to each processing section and blocks formed by a plurality of processing sections, said partitioning plates being provided between the blocks and at said insertion opening and said discharge opening of said casing, and said partitioning plates closing said insertion opening and said discharge opening and partitioning each of the blocks without interfering with a passing of the photosensitive lithographic printing plate; and moving means for moving said partitioning plates to closed positions and open positions.

16. An automatic developing apparatus for photosensitive lithographic printing plates according to claim 15, wherein when the photosensitive lithographic printing plate passes through said processing sections, one of said partitioning plates which is provided at said discharge opening withdraws to a position at which said one of said partitioning plates does not contact the photosensitive lithographic printing plate.

17. An automatic developing apparatus for processing photosensitive lithographic printing plates in which a photosensitive lithographic printing plate is conveyed and is processed by at least developing solution in a processing section having a developing section and a rinsing section, comprising:

a casing for deterring at least the developing solution from being exposed to outside and for enclosing at least said developing section in which the photosensitive lithographic printing plate is processed by the developing solution, said casing having an insertion opening through which the photosensitive lithographic printing plate is inserted and a discharge opening through which the photosensitive lithographic printing plate is discharged;

partitioning plates provided at said insertion opening and said discharge opening, and opening and closing said insertion opening and said discharge opening without interfering when the photosensitive lithographic printing plate passes through said insertion opening and said discharge opening; and rinsing solution supplying means for supplying rinsing solution, which has been used to process the photosensitive lithographic printing plate in said rinsing section, from said rinsing section to said developing section as diluting solution for diluting replenishing solution which is replenished to the developing solution in said developing section, said rinsing solution being water.

18. An automatic developing apparatus according to claim 17, wherein one of said partitioning plates which is provided at said discharge opening is withdrawn from a closed position to a position at which said one of said partitioning plates does not contact the photosensitive lithographic printing plate when the photosensitive lithographic printing plate passes through said processing sections.

* * * * *